United States Patent
Chew

(10) Patent No.: US 10,431,477 B2
(45) Date of Patent: Oct. 1, 2019

(54) METHOD OF PACKAGING CHIP AND CHIP PACKAGE STRUCTURE

(71) Applicant: PEP INNOVATION PTE LTD., Singapore (SG)

(72) Inventor: Hwee Seng Jimmy Chew, Singapore (SG)

(73) Assignee: Pep Innovation PTE Ltd., Singapore (SG)

( * ) Notice: Subject to any disclaimer, the term of this patent is extended or adjusted under 35 U.S.C. 154(b) by 0 days.

(21) Appl. No.: 15/826,261

(22) Filed: Nov. 29, 2017

(65) Prior Publication Data
US 2018/0151392 A1   May 31, 2018

(30) Foreign Application Priority Data

Nov. 29, 2016   (SG) .......................... 10201610034W

(51) Int. Cl.
*H01L 21/56* (2006.01)
*H01L 23/31* (2006.01)
(Continued)

(52) U.S. Cl.
CPC .......... *H01L 21/568* (2013.01); *H01L 21/561* (2013.01); *H01L 21/78* (2013.01);
(Continued)

(58) Field of Classification Search
None
See application file for complete search history.

(56) References Cited

U.S. PATENT DOCUMENTS

| 8,848,380 B2* | 9/2014 | Malatkar ................. H01L 25/16 361/746 |
| 2009/0261466 A1* | 10/2009 | Pagaila ............... H01L 21/6835 257/686 |

(Continued)

OTHER PUBLICATIONS

Co-pending U.S. Appl. No. 15/826,257, entitled, "Method of Packaging Chip and Chip Package Structure," filed Nov. 29, 2017.
(Continued)

*Primary Examiner* — Dung A. Le
(74) *Attorney, Agent, or Firm* — Nixon Peabody LLP; Thomas P. Pavelko

(57) ABSTRACT

The embodiment of the present disclosure discloses a method of packaging a chip and a chip package structure. the method of packaging the chip includes: mounting at least one chip to be packaged and at least one electrically conductive module on a carrier, wherein the at least one chip to be packaged has a back surface facing upwards and an active surface facing towards the carrier, and the at least one electrically conductive module is in the vicinity of the at least one chip to be packaged; forming a first encapsulation layer, wherein the first encapsulation layer covers the entire carrier for encapsulating the at least one chip to be packaged and the at least one electrically conductive module; detaching the carrier to expose the active surface of the at least one chip to be packaged and a first surface of the at least one electrically conductive module; and completing the packaging by a rewiring process on the active surface of the at least one chip to be packaged and the first surface of the at least one electrically conductive module. The present disclosure reduces the difficulty of packaging a chip by mounting the active surface of a chip to be packaged and an electrically conductive module on a carrier and thus saves the cost of packaging.

42 Claims, 12 Drawing Sheets

(51) Int. Cl.
*H01L 23/528* (2006.01)
*H01L 21/78* (2006.01)
*H01L 23/367* (2006.01)
*H01L 25/065* (2006.01)
*H01L 23/498* (2006.01)
*H01L 25/10* (2006.01)
*H01L 23/00* (2006.01)
*H01L 23/538* (2006.01)

(52) U.S. Cl.
CPC ...... *H01L 23/3114* (2013.01); *H01L 23/3135* (2013.01); *H01L 23/367* (2013.01); *H01L 23/49838* (2013.01); *H01L 23/528* (2013.01); *H01L 24/19* (2013.01); *H01L 24/20* (2013.01); *H01L 25/0657* (2013.01); *H01L 25/105* (2013.01); *H01L 23/3128* (2013.01); *H01L 23/5389* (2013.01); *H01L 2224/04105* (2013.01); *H01L 2224/12105* (2013.01); *H01L 2224/18* (2013.01); *H01L 2224/32245* (2013.01); *H01L 2224/73267* (2013.01); *H01L 2224/96* (2013.01); *H01L 2225/1011* (2013.01); *H01L 2225/1058* (2013.01)

(56) References Cited

U.S. PATENT DOCUMENTS

| | | | |
|---|---|---|---|
| 2010/0140779 A1* | 6/2010 | Lin | H01L 23/49816 257/690 |
| 2011/0278741 A1* | 11/2011 | Chua | H01L 21/561 257/777 |
| 2012/0119373 A1* | 5/2012 | Hunt | H01L 21/565 257/774 |
| 2014/0042638 A1* | 2/2014 | Liu | H01L 23/49822 257/774 |
| 2015/0243607 A1* | 8/2015 | Jang | H01L 24/73 438/113 |
| 2016/0155713 A1* | 6/2016 | Kim | H01L 23/645 257/659 |
| 2017/0309571 A1* | 10/2017 | Yi | H01L 23/5389 |

OTHER PUBLICATIONS

Co-pending U.S. Appl. No. 15/826,268, entitled, "Method of Packaging Chip and Chip Package Structure," filed Nov. 29, 2017.

* cited by examiner

METHOD OF PACKAGING CHIP AND CHIP PACKAGE STRUCTURE

TECHNICAL FIELD

The present disclosure relates to the field of semiconductor technology, and in particular, to a method of packaging a chip and to a chip package structure.

BACKGROUND

In the prior art, a common chip packaging technology mainly includes the following processes. First, the active surface of the chip is adhered to the substrate wafer by a tape and plastic-packaged on wafer level, and the substrate wafer is detached. Then, a rewiring layer is formed by performing rewiring on the active surface of the chip, and solder balls are planted. Finally, the package body is cut into single pieces.

SUMMARY

According to the first aspect, the present disclosure provides a method of packaging a chip, including:

mounting at least one chip to be packaged and at least one electrically conductive module on a carrier, wherein the at least one chip to be packaged has a back surface facing upwards and an active surface facing towards the carrier, and the at least one electrically conductive module is in the vicinity of the at least one chip to be packaged;

forming a first encapsulation layer, wherein the first encapsulation layer covers the entire carrier for encapsulating the at least one chip to be packaged and the at least one electrically conductive module;

detaching the carrier to expose the active surface of the at least one chip to be packaged and a first surface of the at least one electrically conductive module; and completing the packaging by a rewiring process on the active surface of the at least one chip to be packaged and the first surface of the at least one electrically conductive module.

Optionally, the step of mounting the at least one chip to be packaged and the at least one electrically conductive module on the carrier includes:

forming an adhesive layer on the carrier; and mounting the at least one electrically conductive module at a first predetermined position of the carrier, and mounting the at least one chip to be packaged at a second predetermined position of the carrier by the adhesive layer.

Optionally, the thickness of the at least one electrically conductive module is greater than or equal to the thickness of the at least one chip to be packaged.

Optionally, the electrically conductive module is an electrically conductive array formed by a plurality of electrically conductive studs, and the electrically conductive array is integrally packaged by an insulating material.

Optionally, the electrically conductive array has at least one opening in the middle; and the at least one chip to be packaged is located in the at least one opening when the electrically conductive array and the at least one chip to be packaged are mounted on the carrier.

Optionally, prior to forming the first encapsulation layer, the method further includes:

forming a sealing layer at least wrapped around the at least one chip to be packaged and the at least one electrically conductive module.

Optionally, the step of forming the sealing layer includes:

covering a sealing material on the carrier mounted with the at least one chip to be packaged and the at least one electrically conductive module by using a semiconductor process; and curing the sealing material to form the sealing layer.

Optionally, the height of the sealing layer is lower than the height of the at least one chip to be packaged, and the sealing layer is a thermosetting insulating material or an ultraviolet curing insulating material.

Optionally, the sealing layer continuously and uninterruptedly covers the surface of the first encapsulation layer and is at least wrapped around the chip.

Optionally, after forming the first encapsulation layer, the method further includes:

thinning the first encapsulation layer to expose a second surface of the at least one electrically conductive module.

Optionally, prior to forming the first encapsulation layer, the method further includes:

forming a thermally conductive structure which includes a thermally conductive material covering the back surface of the at least one chip to be packaged and the second surface of the at least one electrically conductive module, and covering between the at least one chip to be packaged and the at least one electrically conductive module; and a thermally conductive plate formed on a surface of the thermally conductive material.

Optionally, the thermally conductive structure is in a one-to-one correspondence with a unit cut after the packaging is completed, and each unit includes at least one chip to be packaged and at least one electrically conductive module.

Optionally, after forming the first encapsulation layer, the method further includes:

thinning the first encapsulation layer to expose a surface of the thermally conductive plate of the thermally conductive structure.

Optionally, the step of completing the packaging by the rewiring process on the active surface of the at least one chip to be packaged includes:

forming a passivation layer to planarize a side where the active surface of the at least one chip to be packaged and the first surface of the at least one electrically conductive module are located.

Optionally, after forming the passivation layer, the method further includes:

forming a first opening on the passivation layer, the first opening being located at a pad of the at least one chip to be packaged and the at least one electrically conductive module; and forming a first rewiring layer on the passivation layer, the first rewiring layer being electrically connected to the pad of the chip to be packaged and the at least one electrically conductive module through the first opening.

Optionally, the method further includes:

forming a second encapsulation layer on the first rewiring layer and leading out a pad or a connection point of the first rewiring layer by a first electrically conductive stud.

Optionally, the step of forming the second encapsulation layer on the first rewiring layer and leading out the pad or the connection point of the first rewiring layer through the first electrically conductive stud includes:

forming the first electrically conductive stud on the pad or the connection point of the first rewiring layer; and forming the second encapsulation layer on the first rewiring layer and the exposed passivation layer and exposing the first electrically conductive stud; or the step of forming the second encapsulation layer on the first rewiring layer and leading out the pad or the connection point of the first rewiring layer through the first electrically conductive stud includes:

forming the second encapsulation layer on the first rewiring layer and the exposed passivation layer;

forming a second opening on the second encapsulation layer at a position corresponding to the pad or the connection point of the first rewiring layer; and forming the first electrically conductive stud in the second opening.

Optionally, the method further includes:

forming a second rewiring layer on the second encapsulation layer, the second rewiring layer being electrically connected to the pad or the connection point of the first rewiring layer through the first electrically conductive stud; and forming a third encapsulation layer on the second rewiring layer and leading out a pad or a connection point of the second rewiring layer by a second electrically conductive stud.

Optionally, the step of forming a third encapsulation layer on the second rewiring layer and leading out a pad or a connection point of the second rewiring layer by a second electrically conductive stud includes:

forming the second electrically conductive stud on the pad or the connection point of the second rewiring layer; and forming the third encapsulation layer on the second rewiring layer and an exposed second encapsulation layer and exposing the second electrically conductive stud; or forming the third encapsulation layer to encapsulate the second rewiring layer and the exposed second encapsulation layer and leading out the pad or the connection point of the second rewiring layer through the second electrically conductive stud, including:

forming the third encapsulation layer on the second rewiring layer and the exposed second encapsulation layer;

forming a third opening on the third encapsulation layer at a position corresponding to the pad or the connection point of the second rewiring layer; and forming the second electrically conductive stud in the third opening.

Optionally, after completing the packaging by a rewiring process on the active surface of the at least one chip to be packaged and the first surface of the at least one electrically conductive module, the method further includes:

performing cutting so that each package unit formed after the cutting includes at least one chip to be packaged and at least one electrically conductive module in the vicinity.

Optionally, after completing the packaging by a rewiring process on the active surface of the at least one chip to be packaged and the first surface of the at least one electrically conductive module, the method further includes:

disposing at least one passive component on the surface of the first encapsulation layer, the at least one passive component being electrically connected to the second surface of the at least one electrically conductive module.

Optionally, after disposing the at least one passive component on the surface of the first encapsulation layer, the method further includes:

performing cutting so that each package unit formed after the cutting includes at least one chip to be packaged, at least one electrically conductive module in the vicinity, and at least one passive component disposed on the at least one electrically conductive module.

Optionally, prior to mounting the at least one chip to be packaged and the at least one electrically conductive module on the carrier, the method further includes:

forming a protective layer on the active surface of the chip to be packaged.

According to the second aspect, the present disclosure provides a chip package structure, including:

a first encapsulation layer disposed with a plurality of concave first cavities and a plurality of concave second cavities, the second cavities being disposed in the vicinity of the first cavities;

a plurality of chips respectively located in the plurality of first cavities, a back surface of the chip facing towards the first encapsulation layer;

a plurality of electrically conductive modules respectively located in the plurality of second cavities; and a rewiring structure formed on an active surface of the chip and a first surface of the electrically conductive module for leading out pads on the active surface of the chip and the electrically conductive module.

According to the third aspect, the present disclosure provides a chip package structure, including:

a first encapsulation layer disposed with one concave first cavity and at least one concave second cavity;

a chip located in the first cavity, a back surface of the chip facing towards the first encapsulation layer;

at least one electrically conductive module located in the at least one concave second cavity; and a rewiring structure formed on an active surface of the chip and a first surface of the at least one electrically conductive module for leading out pads on the active surface of the chip and the first surface of the electrically conductive module.

Optionally, the chip package structure further includes:

a sealing layer formed on an upper surface of the first encapsulation layer and at least wrapped around the chip and the electrically conductive module.

Optionally, the sealing layer is continuously and uninterruptedly formed on the upper surface of the first encapsulation layer and is at least wrapped around the chip and the electrically conductive module.

Optionally, the chip package structure further includes:

a protective layer formed on the active surfaces of the plurality of chips, wherein the protective layer is formed with first openings, and the first openings are located at positions corresponding to the pads on the active surfaces of the plurality of chips.

Optionally, the chip package structure further includes:

a passivation layer which is formed on the active surface of the chip, the first surface of the electrically conductive module and the exposed first encapsulation layer, or formed on the active surface of the chip, the first surface of the electrically conductive module and the exposed sealing layer, or formed on the protective layer, the first surface of the electrically conductive module and the exposed sealing layer.

Optionally, the rewiring structure includes:

a first rewiring layer formed on the passivation layer and electrically connected to the pad of the chip through the first opening of the passivation layer; and a second encapsulation layer formed on the first rewiring layer and the exposed passivation layer and having a second opening, wherein a first electrically conductive stud electrically connected to the first rewiring layer is disposed in the second opening.

Optionally, the rewiring structure includes:

a first rewiring layer formed on the protective layer and the exposed first encapsulation layer or the sealing layer and electrically connected to the pad of the chip through the first opening; and a second encapsulation layer formed on the first rewiring layer, the exposed protective layer and the sealing layer, or formed on the first rewiring layer, the exposed protective layer and the first encapsulation layer, and having a second opening, wherein a first electrically conductive stud electrically connected to the first rewiring layer is disposed in the second opening.

Optionally, the rewiring structure further includes:

a second rewiring layer formed on the second encapsulation layer and electrically connected to the pad or connection point of the first rewiring layer through the first electrically conductive stud; and a third encapsulation layer for encapsulating the second rewiring layer and the exposed second encapsulation layer and leading out the pad or the connection point of the second rewiring layer through the second electrically conductive stud.

Optionally, the thickness of the electrically conductive module is greater than or equal to the thickness of the chip.

Optionally, the electrically conductive module is an electrically conductive array formed by a plurality of electrically conductive studs, and the electrically conductive array is integrally packaged by an insulating material.

Optionally, the electrically conductive array has at least one opening in the middle; and the chip is located in the at least one opening when the electrically conductive array and the chip are mounted on the carrier.

Optionally, a second surface of the electrically conductive module is exposed from the surface of the first encapsulation layer; and the second surface of the electrically conductive module is opposite to the first surface.

Optionally, the chip package structure further includes:

a thermally conductive structure located on the back surface of the chip and a second surface of the electrically conductive module, the second surface of the electrically conductive module being opposite to the first surface.

Optionally, the thermally conductive structure includes:

a thermally conductive material formed on the back surface of the chip, the second surface of the electrically conductive module, and in a gap between the chip and electrically conductive module; and a thermally conductive plate disposed on the surface of the thermally conductive material.

Optionally, the chip package structure further includes:

a passive component disposed on a surface of the first encapsulation layer and electrically connected to the second surface of the electrically conductive module.

According to the fourth aspect, there is provided a stacked type chip package structure, comprising:

at least one first chip package structure as described in the second aspect or the third aspect; and at least one second chip package structure comprising a packaged chip and a rewiring structure for leading out the pad on the active surface of the chip, wherein, the rewiring structure of the at least one second chip package structure is electrically connected to a second surface of the electrically conductive module of the at least one first chip package structure, and the second surface of the electrically conductive module is opposite to the first surface.

Optionally, the rewiring structure of the second chip package structure includes a rewiring layer and an electrically conductive stud for leading the rewiring layer out of the chip package structure, the electrically conductive stud being electrically connected to a pad or a connection point on the second surface of the electrically conductive module of the first chip package structure.

Optionally, the second chip package structure is the chip package structure as described in the second aspect or the third aspect.

DETAILED DESCRIPTION

Figure 1:
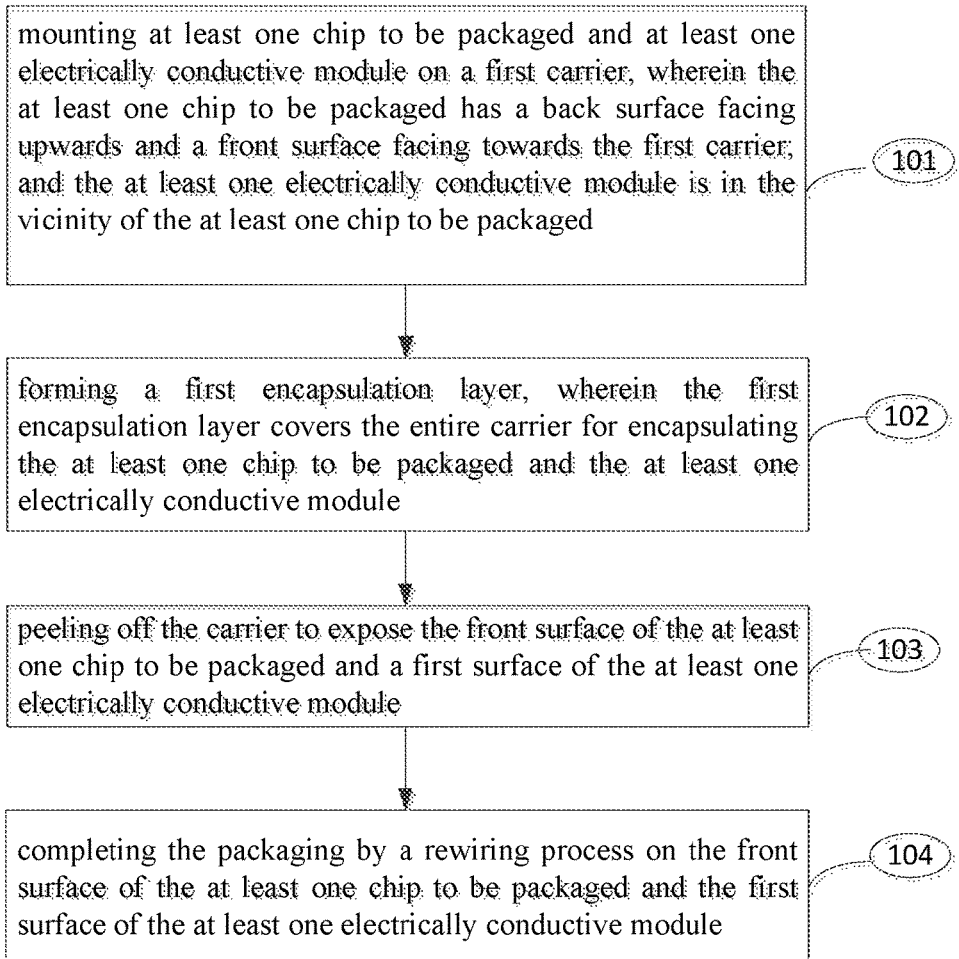
FIG. 1 is a flowchart of a method of packaging a chip according to an exemplary embodiment of the present disclosure.

To make the objectives, technical solutions, and advantages of the present disclosure more comprehensible, the present disclosure is further described in detail below with reference to the specific embodiments and the accompanying drawings.

However, those skilled in the art will readily appreciate that the detailed description given herein with respect to these drawings is for explanatory purposes as the disclosure extends beyond these limited embodiments. For example, if should be appreciated that those skilled in the art will, in light of the teachings of the present disclosure, recognize a multiplicity of alternate and suitable approaches, depending upon the needs of the particular application, to implement the functionality of any given detail described herein, beyond the particular implementation choices in the following embodiments described and shown. That is, there are modifications and variations of the disclosure that are too numerous to be listed but that all fit within the scope of the disclosure. Also, singular words should be read as plural and vice versa and masculine as feminine and vice versa, where appropriate, and alternative embodiments do not necessarily imply that the two are mutually exclusive.

It is to be further understood that the present disclosure is not limited to the particular methodology, compounds, materials, manufacturing techniques, uses, and applications, described herein, as these may vary. It is also to he understood that the terminology used herein is used for the purpose of describing particular embodiments only, and is not intended to limit the scope of the present disclosure. It must, be noted that as used herein and in the appended claims, the singular forms "a," "an, " and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein arc to be understood also to refer to functional equivalents of such structures, language that may be construed to express approximation should be so understood unless the context clearly dictates otherwise.

As used in this specification and claim(s), the words 'comprising' (and any form of comprising, such as 'comprise' and 'comprises'), 'having' (and any form of having, such as 'have' and 'has'), 'including' (and any form of including, such as 'includes' and 'include'), or 'containing' (and any form of containing, such as 'contains' and 'contain') are inclusive or open-ended and do not exclude additional, unrecited elements or method steps.

During packaging, when it is necessary to dispose a metallic conductor around the packaged chip for electrical connection with the chip, it is common practice to grow the required metallic conductor on a metal carrier at a predetermined position of the carrier by an electroplating process. However, this method leads to the difficulty of subsequent chip packaging process, and is not suitable for adhering the active surface of the chip to the carrier through an adhesive layer and then removing the carrier.

According to various embodiments of the present disclosure, there is provided a method of packaging a chip. During packaging, a chip to be packaged is mounted on a carrier. At the same time, a required electrically conductive module is also mounted on the carrier according to actual requirements. The active surface of the chip to be packaged faces towards the carrier, and the back surface faces upwards, i.e., faces outwards with respect to the carrier. Then, a first encapsulation layer is formed, and the first encapsulation layer covers the entire carrier to encapsulate the chip to be packaged and the electrically conductive module. After the packaging is completed, the carrier is detached, i.e., the carrier is removed to exposed the active surface of the chip to be packaged, the first surface of the electrically conductive module, and the first encapsulation layer. Then, a rewiring process may be performed on the active surface of the chip to be packaged and the first surface of the electrically conductive module. In the above embodiment of the present disclosure, by mounting the active surface of the chip to be packaged and the electrically conductive module on the carrier, a rewiring can be performed on the active surface of the chip to be packaged and the first surface of the electrically conductive module after removing the carrier in the subsequent process. The difficulty of the chip packaging is reduced and thus the cost of packaging is saved.

FIG. 1 is a flowchart of a method of packaging a chip according to an exemplary embodiment of the present disclosure. As shown in FIG. 1, the method of packaging the chip includes the following steps 101 to 104. Wherein, in step 101, at least one chip to be packaged and at least one electrically conductive module are mounted on a carrier, the at least one chip to be packaged has a back surface facing upwards and an active surface facing towards the carrier, and the at least one electrically conductive module is in the vicinity of the at least one chip to be packaged.

Figure 2:
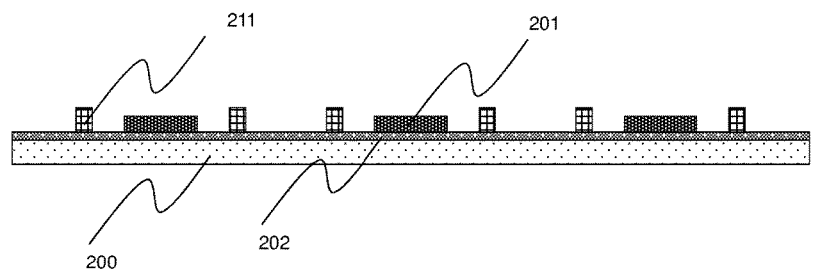
FIGS. 2 (*a*) to (*s*) are process flowcharts of a method of packaging a chip in an exemplary embodiment of the present disclosure.
Figure 2:
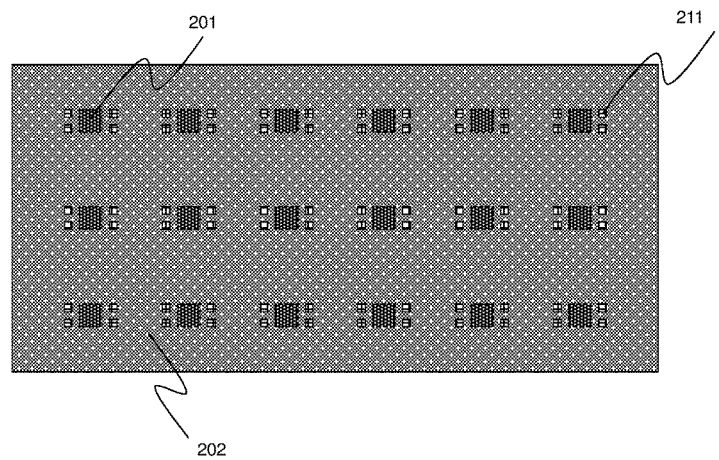
Figure 2:
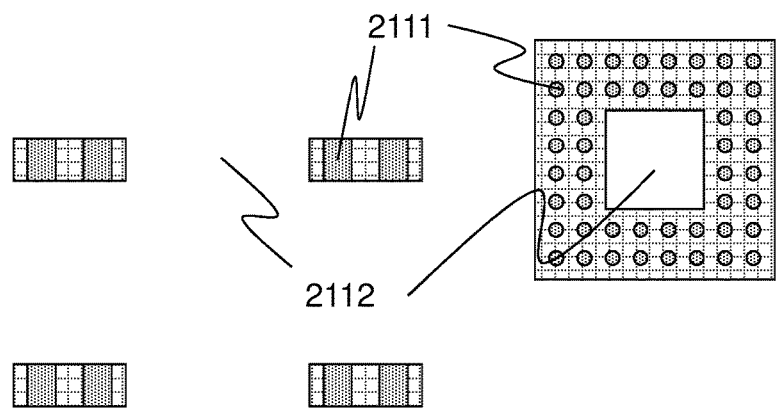
Figure 2:
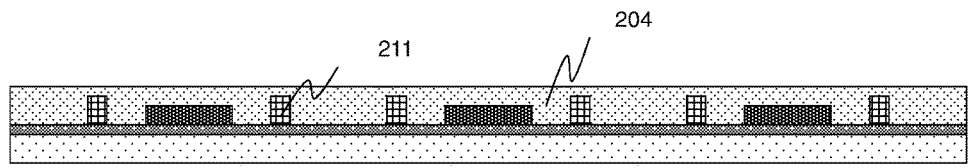
Figure 2:
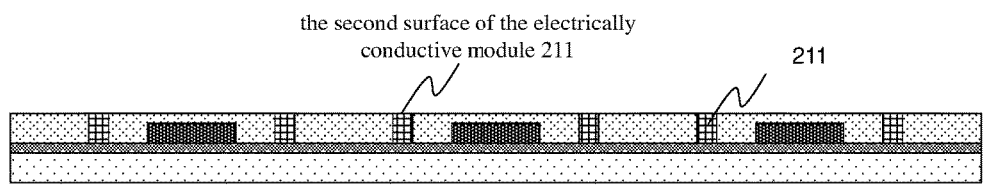
Figure 2:
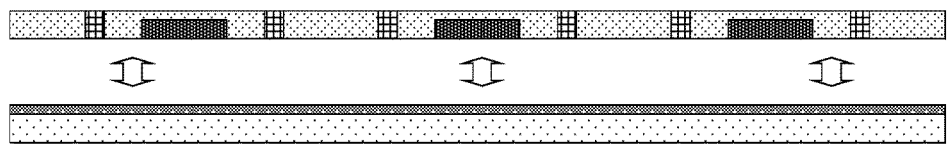
Figure 2:
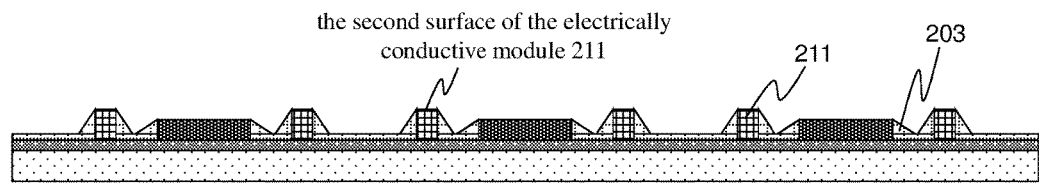
Figure 2:
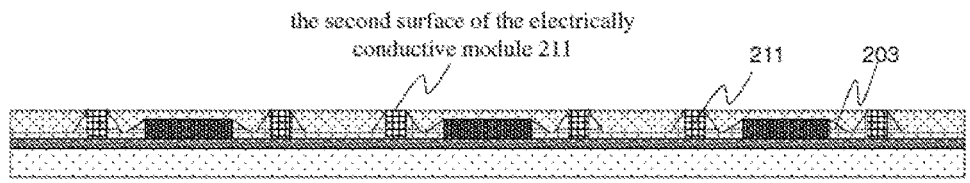
Figure 2:
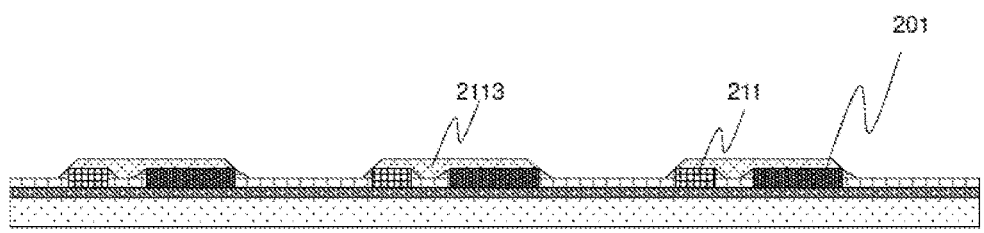
Figure 2:
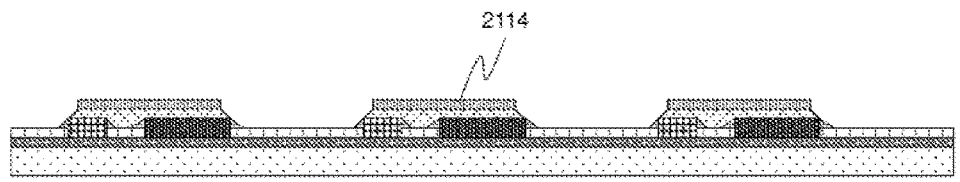
Figure 2:
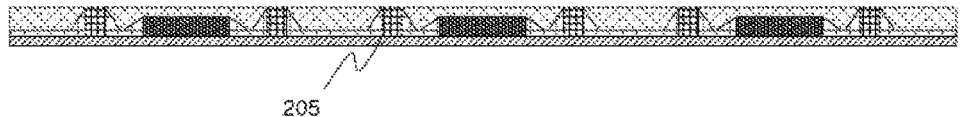
Figure 2:
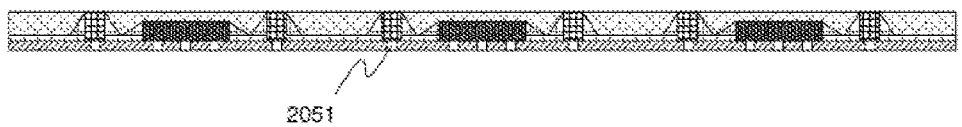
Figure 2:
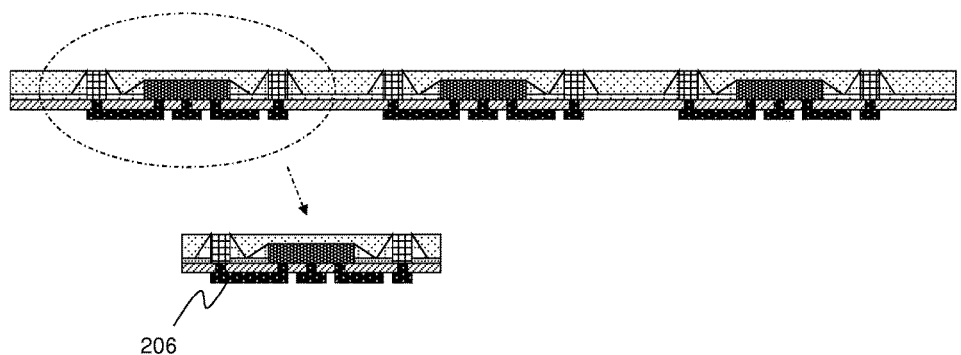
Figure 2:
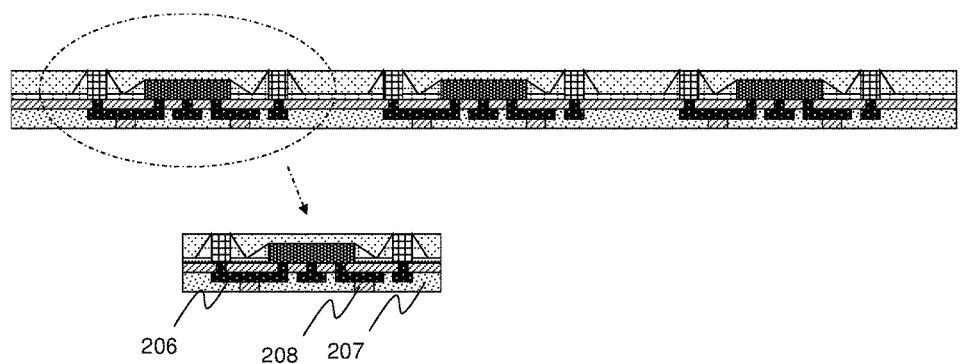
Figure 2:
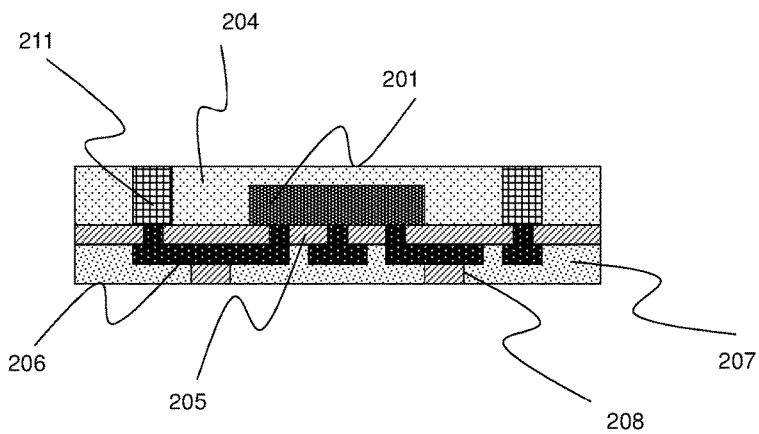
Figure 2:
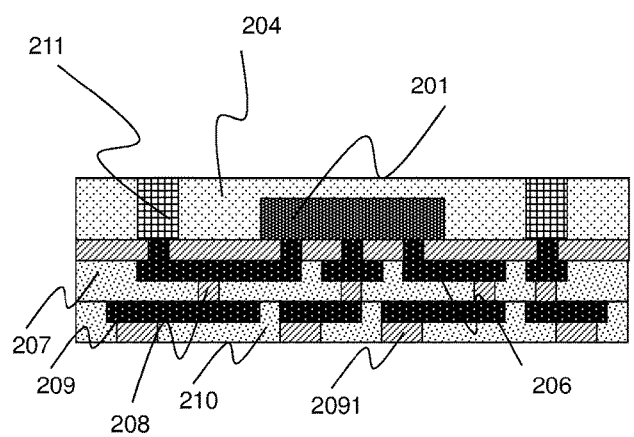
Figure 2:
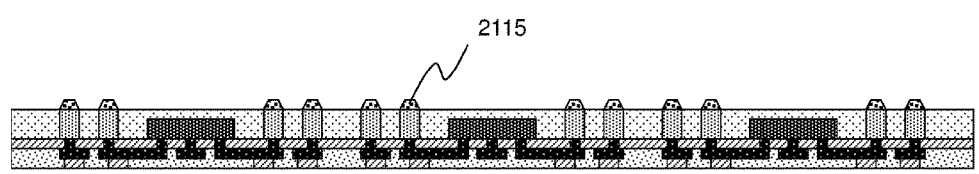
Figure 2:
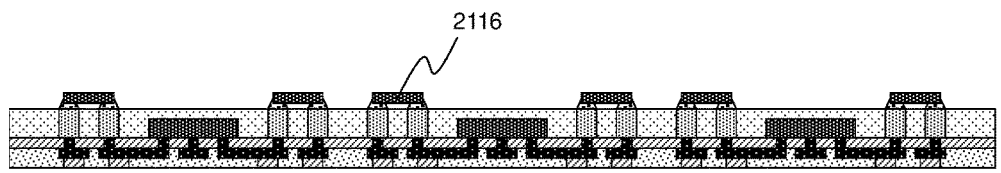
Figure 2:
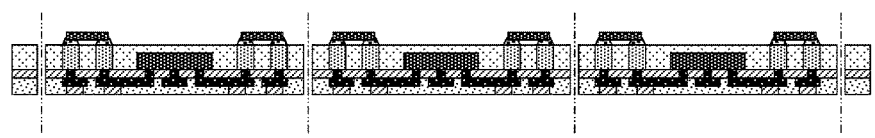

FIGS. 2 (a) to (s) show the process flowcharts of a method of packaging a chip in an exemplary embodiment of the present disclosure.

As shown in FIG. 2 (a), chips 201 to be packaged (a plurality of chips to be packaged are shown in the figure) and electrically conductive modules 211 are mounted on a carrier 200. The chip 201 to be packaged, the electrically conductive module 211 and the carrier 200 are connected by an adhesive layer 202.

In one embodiment, the chip 201 to be packaged is formed by thinning and cutting a semiconductor wafer. The active surface of the chip 201 to be packaged is configured by conductive electrodes that are led out from an internal circuit of the chip to the surface of the chip. Pads are prepared on these conductive electrodes. On the carrier 200, the adhering positions of the chip 201 to be packaged and the electrically conductive module 211 may be marked in advance respectively.

In one embodiment, the electrically conductive module 211 may be made of an electrically conductive metal such as copper, zinc, iron, aluminum, gold and silver. The electrically conductive module 211 may be a metal stud made of metal. One or more electrically conductive modules 211 may be disposed around each chip to be packaged. The specific number, shape, etc. may be set according to actual requirements. The electrically conductive module 211 may be obtained by cutting a metal plate or cutting off a metal wire with a corresponding diameter. The electrically conductive module 211 may be placed at a predetermined position in a manner of Tape & Reel or Pick & Place when adhering the same. The electrically conductive module 211 may be any shape and size, for example, has a cross section of circular shape, square shape, triangular shape or the like, and is specifically set according to actual requirements.

In one embodiment, the shape of the carrier 200 may include circular shape, rectangular shape or other shapes. The present disclosure does not limit the shape of the carrier 200. The carrier 200 may be a small-sized wafer substrate, or may be a larger-sized carrier such as a stainless steel plate, a polymer substrate, or the like. With the method of packaging the chip according to the embodiment of the present disclosure, a carrier has a size up to 600*600 mm may be adopted.

In one embodiment, the chip 201 to be packaged and the electrically conductive module 211 may be mounted on the carrier 200 by an adhesive layer 202. An easily detachable material may be used for the adhesive layer 202 so as to detach the carrier 200 from the chip 201 to be packaged having been packaged on the back surface. For example, a thermal separation material capable of losing its viscosity by heating may be used. In other embodiments, the adhesive layer 202 may adopt a two-layer structure including a layer of thermal separation material and a chip attachment layer. The layer of thermal separation material is adhered to the carrier 200 and will lose its viscosity when heated, and can be detached from the carrier 200. The chip attachment layer adopts a layer of adhesive material, and can be used for adhering the chip 201 to be packaged and the electrically conductive module 211. After the chip 201 to be packaged and the electrically conductive module 211 are detached from the carrier 200, the chip attachment layer may be removed by chemical cleaning. In one embodiment, the adhesive layer 202 may be formed on the carrier 200 by lamination, printing, or the like.

In one embodiment, when the chip 201 to be packaged and electrically conductive module 211 are adhered, the electrically conductive module 211 may be adhered at a first predetermined position of the electrically conductive module 211 and then the chip 201 may be adhere at a second predetermined position of the chip. It will of course be understood that, in other embodiments, the chip 201 to be packaged may be adhered first, and then the electrically conductive module 211 is adhered. Prior to the formation of the adhesive layer 202, the adhering position of the chip to be packaged may be marked on the carrier 200 by laser, mechanical engraving, photolithography, or the like. At the same time, an alignment mark is also provided on the chip 201 to be packaged so as to be aligned with the adhering position on the carrier 200 at the time of adhering. It can be understood that, in one packaging process, there may be a plurality of chips 201 to be packaged, and there may also be a plurality of electrically conductive modules 211, that is a plurality of chips 201 to be packaged and electrically conductive modules 211 are simultaneously mounted on the carrier 200 for packaging, and then cut into a plurality of package bodies after the packaging is completed. One package body may include one or more chips, and a plurality of electrically conductive modules may be disposed around one chip. The positions of a plurality of chips and electrically conductive modules may be freely set according to the actual product requirements. A schematic plan view after adhering the chips 201 to be packaged and the electrically conductive modules 211 is as shown in FIG. 2 (b). In FIG. 2 (b), four stud-shaped electrically conductive modules 211 are formed around each chip to be packaged. The specific amount of the electrically conductive modules depends on the actual use of the electrically conductive modules and the actual requirements of the package structure.

In one embodiment, the electrically conductive module 211 may be an electrically conductive array formed by a plurality of electrically conductive studs, and the electrically conductive array is integrally packaged by an insulating material.

As shown in FIG. 2 (c), the electrically conductive module 211 may also be a hollow array formed by a plurality of electrically conductive studs 2111. That is, the array formed by the electrically conductive module 211 has an opening 2112 in the middle. When being adhered on the carrier 200, the chip 201 to be packaged is located in the opening 2112 such that the electrically conductive studs 2111 in the electrically conductive module 211 are uniformly distributed around the chip 201 to be packaged, so that one chip 201 to be packaged corresponds to one electrically conductive module 211. The electrically conductive module 211 may be formed by previously forming an array of electrically conductive studs by electroplating on other carrier and then integrally packaging the electrically conductive studs with an insulating material. Of course, in other embodiments, the electrically conductive module 211 may further include an array formed by other composites, such as an array structure configured by induction coils, and the like. The electrically conductive stud may be a metal post, a metal block or the like.

In step 102, a first encapsulation layer is formed. The first encapsulation layer covers the entire carrier for encapsulating the at least one chip to be packaged and the at least one electrically conductive module.

As shown in FIG. 2 (d), the first encapsulation layer 204 is formed on the entire surface of the carrier 200 to which the chip 201 to be packaged and the electrically conductive module 211 are adhered, for covering the chip 201 to be packaged and the electrically conductive module 211 to reconstruct a flat plate structure so that after the carrier 200 is detached, rewiring and packaging can continue on the reconstructed flat plate structure. Optionally, prior to forming the first encapsulation layer 204, some pretreatment steps, such as chemical cleaning and plasma cleaning, may be performed to remove impurities on the surface, so that the first encapsulation layer 204 can be more closely connected to the chip to be packaged and the carrier without cracking.

In one embodiment, the first encapsulation layer 204 may be formed by laminating an epoxy resin film or ABF (Ajinomoto buildup film), or may be formed by performing injection molding, compression molding or transfer molding with respect to an epoxy resin compound). The first encapsulation layer 204 includes a first surface 2041 opposite to the carrier 200 and is substantially flat and parallel to the surface of the carrier 200. The thickness of the first encapsulation layer 204 may be thinned by grinding or polishing the first surface 2041.

In one embodiment, the thickness of the electrically conductive module 211 is greater than or equal to the thickness of the chip 201 to be packaged. As shown in FIG. 2 (e), the thickness of the first encapsulation layer 204 can be reduced to the second surface of the electrically conductive module 211 such that the second surface of the electrically conductive module 211 is exposed from the surface of the first encapsulation layer 204. The second surface of the electrically conductive module 211 is opposite to the first surface.

In step 103, the carrier is detached to expose the active surface of the at least one chip to be packaged and a first surface of the at least one electrically conductive module.

In one embodiment, as shown in FIG. 2 (f), the carrier 200 can be directly mechanically detached from the first encapsulation layer 204, the chip 201 to be packaged and the electrically conductive module 211. When the adhesive layer 202 between the carrier 200 and the chip 201 to be packaged is provided with a thermal separation material, the thermal separation material on the adhesive layer 202 may also be heated to reduce the viscosity, so as to detach the carrier 200. After the carrier 200 is detached, the lower surface of the first encapsulation layer 204, the active surface of the chip 201 to be packaged and the first surface of the electrically conductive module 211 facing towards the carrier 200 are exposed. Of course, in some embodiments, if a protective layer is formed on the active surface of the chip 201 to be packaged, or a winding layer is formed on the active surface of the chip (the winding layer is used to wind the pad on the active surface of the chip to other position), the protective layer or the winding layer on the active surface of the chip 201 to be packaged is exposed. After the carrier 200 is detached, a flat plate structure including at least one chip 201 to be packaged, at least one electrically conductive module 211, and the first encapsulation layer 204 which encapsulates the back surface of the chip 201 to be packaged and the second surface of the electrically conductive module 211.

In step 104, the packaging is completed by a rewiring process on the active surface of the at least one chip to be packaged and the first surface of the at least one electrically conductive module.

In the present embodiment, after the packaging of the back surface of the chip 201 to be packaged and the second surface of the electrically conductive module 211 is completed and the carrier 200 is detached to expose the active surface of the chip 201 to be packaged and the first surface of the electrically conductive module 211, specifically, rewiring and the like may be performed with respect to the active surface of the chip to be packaged according to the actual application.

In one embodiment, the above-described method of packaging a chip further includes:

forming a sealing layer at least wrapping around the at least one chip to be packaged and the at least one electrically conductive module.

As shown in FIG. 2 (g), the sealing layer 203 is formed on the chip 201 to be packaged, the electrically conductive module 211 and the exposed adhesive layer 202 so as to wrap up the chip 201 to be packaged and the electrically conductive module 211. In one embodiment, the sealing layer 203 may adopt polymer insulating material liquid or paste and may be formed by spraying, printing, coating, dispensing etc. The thickness of the sealing layer 203 is smaller than the thickness of the chip 201 to be packaged.

In actual operation, since the polymer insulating material is preferably liquid or pasty, after the spraying is completed, it will flow to surround the chip 201 to be packaged and the electrically conductive module 211 and cover the entire surface of the carrier 200. After the polymer is cured by thermal curing, the sealing layer 203 can wrap up the chip 201 to be packaged and the electrically conductive module 211 to lock the positions of the chip 201 to be packaged and the electrically conductive module 211 unchanged. The shape of the sealing layer 203 mainly depends on the properties such as viscosity, tension and the like of the material of the adhesive layer formed on the carrier 200. The sealing layer shall be curable material, and cured by using high temperature, ultraviolet rays or the like. According to the above embodiment of the present disclosure, the sealing layer 203 is at least wrapped around the chip 201 to be packaged and the electrically conductive module 211 so as to avoid the situation that after the chip 201 to be packaged and the electrically conductive module 211 shifted in a subsequent process, the rewiring layer cannot be electrically connected to the pads on the active surface of the chip 201 to be packaged and the electrically conductive module 211 due to the inability to predict the positions of the chip 201 to be packaged and the electrically conductive module 211 after the shift. Optionally, when the sealing layer 203 is formed, the sealing layer material covers the entire carrier 200, so that the sealing layer 203 forms a continuous piece to achieve the optimal effect of locking the chip.

In one embodiment, the step of forming the sealing layer includes:

covering a sealing material on the carrier mounted with the at least one chip to be packaged and the at least one electrically conductive module by using a semiconductor process; and curing the sealing material to form a sealing layer at least wrapped around the at least one chip to be packaged and the at least one electrically conductive module.

In this embodiment, the sealing layer 203 continuously and uninterruptedly covers the surface of the first encapsulation layer and is at least wrapped around the chip. In some embodiments, an individual sealing layer 203 may be a whole continuous piece without any interruption. In other embodiments, after the sealing layer is sprayed, the sealing layer material on the back surface of the chip 201 to be packaged and/or the second surface of the electrically conductive module 211 may be first removed to expose the second surface of the electrically conductive module 211, so that the sealing layer 203 has a plurality of holes, and each hole corresponds to one chip 201 to be packaged and/or the electrically conductive module 211.

According to the embodiment of the present disclosure, the sealing layer is used to cover completely or cover around the chip to be packaged and the electrically conductive module. Since the sealing layer is formed by spraying, printing, coating, dispensing or the like without pressure (or under low pressure), the chip and/or the electrically conductive module will not shift or fall off during the formation of the sealing layer. When the encapsulation layer is subsequently formed (after the sealing layer material is cured), due to the locking effect of the sealing layer, the chip to be packaged and the electrically conductive module are locked at the mounting position and are less prone to shift or fall off.

In one embodiment, after forming the first encapsulation layer, the method further includes:

thinning the first encapsulation layer to expose a second surface of the at least one electrically conductive module.

In this embodiment, if the electrically conductive module 211 is used for electrical connection with other chip package structures, passive components or other electrical units, the second surface of the electrically conductive module 211 can be exposed by thinning the first encapsulation layer. FIG. 2 (H) shows the structure in which the sealing layer 203 is formed. The first encapsulation layer may be thinned to the second surface of the electrically conductive module by mechanical grinding.

In one embodiment, prior to forming the first encapsulation layer, the method of packaging the chip further includes:

forming a thermally conductive structure which includes a thermally conductive material covering the back surface of the at least one chip to be packaged and the second surface of the at least one electrically conductive module, and covering between the at least one chip to be packaged and the at least one electrically conductive module; and a thermally conductive plate formed on a surface of the thermally conductive material.

In this embodiment, the thermally conductive structure is formed on the second surface of the electrically conductive module 211 and the back surface of the chip 201 to be packaged for heat dissipation. In this case, the electrically conductive module 211 may be a metal block with a relatively large surface area. That is, the area of the first surface or the second surface of the electrically conductive module may be larger than a predetermined threshold, so as to provide a better heat dissipation effect. The thermally conductive structure includes a thermally conductive material 2113 and a thermally conductive plate 2114. The thermally conductive material 2113 is formed on the second surface of the electrically conductive module 211 and the back surface of the chip 201 to be packaged, capable of covering the second surface of the electrically conductive module 211 and the back surface of the chip 201 to be packaged, and is filled in a gap formed between the electrically conductive module 211 and the chip 201 to be packaged. For a structure formed with the sealing layer 203, the thermally conductive material 2113 is also formed on the surface of the sealing layer 203 for packaging one chip 201 to be packaged and one or more electrically conductive modules 211 corresponding thereto in the thermally conductive material 2113. One or more electrically conductive modules 211 may be disposed around one chip 201 to be packaged. The amount of the electrically conductive modules 211 is set according to the use of the electrically conductive module 211, i.e., it needs to be set according to the actual requirements for structure. After the packaging is completed, the cut unit includes at least one chip 201 to be packaged and at least one electrically conductive module 211. That is, the unit package structure may include one chip and one or more electrically conductive modules, and may also include a plurality of chips and one or more electrically conductive modules. The chip to be packaged and the electrically conductive module included in each unit are a group, and each group corresponds to a thermally conductive structure. The thermally conductive material 2113 connects the chip 201 to be packaged and the one or more electrically conductive modules 211 in each group, and then a thermally conductive plate 2114 is disposed on the surface of the thermally conductive material to realize the thermally conductive structure. The thermally conductive material 2113 may a pasty material and may be a curable material. After the pasty material is filled between the chip 201 to be packaged and the electrically conductive module corresponding thereto and covers the upper surfaces of both, thermal curing or UV curing can be performed. FIGS. 2 (i) to 2 (j) show the schematic diagrams of the manufacturing process of the thermally conductive structure in the case where the sealing layer 203 is formed.

In one embodiment, the thermally conductive plate may be placed on the thermally conductive material. Each group formed by the chip 201 to be packaged and one or more electrically conductive modules 211 corresponds to one thermally conductive plate. The thermally conductive material completely fill the gap among the thermally conductive plate, the electrically conductive module and the chip to be packaged, and forms a heat dissipation path from the chip to be packaged to the electrically conductive module via the thermally conductive plate. The thermally conductive material may be a pasty material capable of compensating for the difference in thickness between the electrically conductive module and the chip to be packaged before being cured and forming a rigid support of the thermally conductive plate, the electrically conductive module and the chip to be packaged after curing. The thermally conductive plate may be aligned and placed on the thermally conductive material in a conventional manner of Tape & Reel or Pick & Place.

In one embodiment, after forming the first encapsulation layer, the method of packaging the chip further includes:

thinning the first encapsulation layer to expose a surface of the thermally conductive plate of the thermally conductive structure.

In this embodiment, in order to improve the heat dissipation efficiency of the thermally conductive structure, the first encapsulation layer may be thinned to the surface of the thermally conductive plate so that the surface of the thermally conductive plate is exposed to more effectively derive the heat generated by the packaged chip when it is used in packaging the chip.

In one embodiment, step 104, that is, the step of completing the packaging by the rewiring process on the active surface of the at least one chip to be packaged, may further include:

forming a passivation layer on the active surface of the at least one chip to be packaged and the first surface of the at least one electrically conductive module.

In this embodiment, after the carrier 200 is detached, the active surface of the chip 201 to be packaged and the first surface of the electrically conductive module 211 are disposed. If the sealing layer 203 is not formed, the surface of the first encapsulation layer 204 is also disposed. If the sealing layer 203 is formed, the surface of the sealing layer 203 is disposed. After the carrier is detached, the side where the active surface of the chip 201 to be packaged is located includes the chip 201 to be packaged, the electrically conductive module 211 and the first encapsulation layer 204 (or the sealing layer 203), and in order to complete the rewiring process, a passivation layer 205 may be formed on this side. FIG. 2 (k) shows a schematic structural diagram of forming the passivation layer 205 in the case where the sealing layer 203 is formed In one embodiment, after the passivation layer is formed, the method of packaging the chip further includes:

forming a first opening on the passivation layer, the first opening being located at a pad of the at least one chip to be packaged and the at least one electrically conductive module; and forming a first rewiring layer on the passivation layer, the first rewiring layer being electrically connected to the pad of the chip to be packaged and the at least one electrically conductive module through the first opening.

In the embodiment, the active surface of the chip 201 to be packaged has pads of the chip internal circuit. By rewiring on the active surface of the chip 201 to be packaged, these pads can be led out. At the same time, the rewiring layer can also lead out the pads on the electrically conductive module (If the electrically conductive module is a single metal post or a metal block, this electrically conductive module is directly led out. If the electrically conductive module is a structure in which a plurality of metal posts or metal blocks are integrated, each metal post or metal block can be led out). As shown in FIG. 2 (k), during rewiring, the passivation layer 205 may be formed on the exposed sealing layer 203 (on the exposed first encapsulation layer 204 if the sealing layer 203 is not formed) and the active surface of the chip 201 to be packaged to protect the active surface of the chip to be packaged 203 and provide a flat surface for the subsequent processes. The passivation layer 205 may be formed of polyimide or polymer material by screen-printing, spray-coating, lamination or the like. Optionally, the material of the passivation layer 205 may be cured by high temperature or ultraviolet rays.

In one embodiment, the material of the passivation layer 205 may be the same as the material of the sealing layer 203.

In one embodiment, after the passivation layer 205 is formed, the first rewiring layer 206 is formed on the passivation layer 205. The first rewiring layer 206 is electrically connected to the pad on the active surface of the chip 201 to be packaged through the first opening 2051 in the passivation layer 205. As shown in FIG. 2 (l), the first opening 2051 may be formed in the passivation layer 205 in a manner of hole-opening after the passivation layer 205 is formed, such that the pad on the active surface of the chip 201 to be packaged or the wiring led out from the pad is exposed from the first opening 2051. If the material of the passivation layer 205 is a laser reactive material, the hole-opening can be performed in a manner of forming one first opening 2051 at one time by laser patterning. If the material of the passivation layer is a photosensitive material, the hole-opening can be performed in a manner of forming a plurality of first openings 2051 at one time by photolithographic patterning.

In one embodiment, as shown in FIG. 2 (*m*), the first rewiring layer 206 is formed on the surface of the passivation layer 205. The first rewiring layer 206 is formed of an electrically conductive material, for example, a metal such as copper, nickel, gold and the like. The first rewiring layer 206 includes a connecting portion filled in the first opening 2051 and a patterned wiring formed on the surface of the passivation layer 205. The connecting portion is electrically connected to the pad on the surface of the chip 201 to be packaged, and the patterned wiring is electrically connected to the connecting portion.

In one embodiment, the method of packaging the chip further includes:

forming a second encapsulation layer on the first rewiring layer and leading out a pad or a connection point of the first rewiring layer by a first electrically conductive stud.

As shown in FIG. 2 (*n*), after forming the first rewiring layer 206, it is packaged with the second encapsulation layer 207. After the packaging is completed, the patterned wiring on the first rewiring layer 206 is exposed from the surface of the second encapsulation layer 207 through the first electrically conductive stud 208 (for example, a metal post or a protruding pad).

In one embodiment, the step of forming the second encapsulation layer on the first rewiring layer and leading out the pad or the connection point of the first rewiring layer through the first electrically conductive stud includes:

forming the first electrically conductive stud on the pad or the connection point of the first rewiring layer; and forming the second encapsulation layer on the first rewiring layer and the exposed passivation layer and exposing the first electrically conductive stud.

In this embodiment, the first electrically conductive stud 208 is formed by photolithography and electroplating on the patterned wiring of the first rewiring layer 206. And then, the second encapsulation layer 207 is formed so that the first electrically conductive stud 208 is embedded in the second opening of the second encapsulation layer 207.

In another embodiment, the step of forming the second encapsulation layer on the first rewiring layer and leading out the pad or the connection point of the first rewiring layer through the first electrically conductive stud includes:

forming the second encapsulation layer on the first rewiring layer and the exposed passivation layer;

forming a second opening on the second encapsulation layer at a position corresponding to the pad or the connection point of the first rewiring layer; and forming the first electrically conductive stud in the second opening.

In this embodiment, the second encapsulation layer 207 may be formed on the first rewiring layer 206, then the second opening is formed in the second encapsulation layer 207 by hole-opening, and the second opening is filled with an electrically conductive material to form the first electrically conductive stud 208.

The shape of the first electrically conductive stud 208 is preferably circular, and or course may be other shapes such as rectangular, square and the like. The electrically conductive stud 208 is physically and electrically connected to the first rewiring layer 206.

In one embodiment, the second encapsulation layer 207 may be formed by laminating, embossing or screen printing, and an epoxy compound is preferably used. The second encapsulation layer 207 covers the passivation layer 205 and the first rewiring layer 206. The first rewiring layer 206 is exposed from the surface of the second encapsulation layer 207 through the first electrically conductive stud 208. When the first electrically conductive stud 208 is first formed and the second encapsulation layer 207 is formed, the second encapsulation layer 207 covers all the exposed surfaces of the passivation layer 205 and the first rewiring layer 206, and then thinned to the surface of the first electrically conductive stud 208.

In one embodiment, if only one layer of wiring needs to be formed according to the actual requirements for packaging, when a plurality of chips 201 to be packaged are packaged together, after the packaging of the first rewiring layer is completed, the entire package structure is cut into a plurality of package units by laser or mechanical cutting. Each package unit includes at least one chip 201 to be packaged and at least one electrically conductive module 211. That is, each package unit may include one or more chips 201 to be packaged, and each chip 201 to be packaged in each package unit may correspond to one or more electrically conductive modules 211. FIG. 2 (*o*) shows a plurality of package units after cutting. Each package unit shown in the figure includes one chip to be packaged and a plurality of electrically conductive modules. Of course, in other embodiments, each package unit may include a plurality of chips to be packaged and a plurality of electrically conductive modules.

In another embodiment, the method of packaging the chip further includes:

forming a second rewiring layer on the second encapsulation layer, the second rewiring layer being electrically connected to the pad or the connection point of the first rewiring layer through the first electrically conductive stud; and forming a third encapsulation layer on the second rewiring layer and leading out a pad or a connection point of the second rewiring layer through a second electrically conductive stud.

In the present embodiment, the second rewiring layer 209 is formed on the first rewiring layer 206. The first rewiring layer 206 and the second rewiring layer 209 are electrically connected through the first electrically conductive stud 208. The pad or the connection point on the second rewiring layer 209 is led out through the second electrically conductive stud 2091 and the second rewiring layer 209 and the exposed second encapsulation layer 207 are covered by the third encapsulation layer 210. The second electrically conductive stud 2091 leads out the pad or the connection point on the second rewiring layer 209 through the third opening in the third encapsulation layer 210. In this way, a multilayer package structure can be realized. The structure diagram of the formed multilayer-packaged chip is shown in FIG. 2 (*p*).

In one embodiment, the step of forming a third encapsulation layer on the second rewiring layer and leading out a pad or a connection point of the second rewiring layer by a second electrically conductive stud, includes:

forming the second electrically conductive stud on the pad or the connection point of the second rewiring layer; and forming the third encapsulation layer on the second rewiring layer and an exposed second encapsulation layer and exposing the second electrically conductive stud.

In another embodiment, the step of forming the third encapsulation layer to encapsulate the second rewiring layer and the exposed second encapsulation layer and leading out the pad or the connection point of the second rewiring layer through the second electrically conductive stud, includes:

forming the third encapsulation layer on the second rewiring layer and the exposed second encapsulation layer;

forming a third opening on the third encapsulation layer at a position corresponding to the pad or the connection point of the second rewiring layer; and forming the second electrically conductive stud in the third opening.

The forming manner of the second rewiring layer is similar to the forming manner of the first rewiring layer. The second electrically conductive stud may be formed on the second rewiring layer after the second rewiring layer is formed and then the third encapsulation layer is formed, and the second electrically conductive stud is exposed by a corresponding process so that the second electrically conductive stud can lead out the pad or the connection point on the second rewiring layer. The third encapsulation layer may also be formed on the second rewiring layer first and then the third opening is formed in the third encapsulation layer, and the second electrically conductive stud is formed in the third opening so that the second electrically conductive stud can be electrically connected to the pad or the connection point on the second rewiring layer. For the specific details, reference may be made to the description of the first rewiring layer described above, and details are not described herein again.

In one embodiment, for the multilayer wiring structure, after the second wiring layer is formed and encapsulated by the third encapsulation layer, cutting is performed so that each of the package units formed after the cutting includes at least one chip to be packaged and at least one electrically conductive module in the vicinity.

After the packaging is completed by a rewiring process on the active surface of the at least one chip to be packaged and the first surface of the at least one electrically conductive module, the method further includes:

disposing at least one passive component on the surface of the first encapsulation layer, the at least one passive component being electrically connected to the second surface of the at least one electrically conductive module.

In this embodiment, the second surface of the electrically conductive module 211 is exposed from the first encapsulation layer. According to the actual requirements for the packaged chip structure, if a passive component needs to be disposed, at least one passive component may be disposed on the surface of the first encapsulation layer after the chip packaging is completed. The passive component is electrically connected to the at least one electrically conductive module 211. In the prior art, when a passive component needs to be disposed in the chip package structure, the passive component is usually packaged with the chip together inside the package unit. In this way, the size of the passive component will be limited, or the size of the passive component will cause the size of the package structure too large and so on. In the manner of this embodiment, since the passive component is disposed outside the package structure, i.e., the outer surface of the first encapsulation layer, the size of the passive component will not have any effect on the size of the package structure itself, and the size of the passive component is also not limited at all.

The passive component may be a capacitor, a resistor, an inductor or an integrated passive device. The passive component includes an active surface and a back surface, and the active surface is exposed with a pad. The pad on the active surface of the passive component active surface is electrically connected with the surface of the electrically conductive module. Depending on the actual situation of the circuit connection between the chip and the passive component, the passive component may be electrically connected to one or more electrically conductive modules corresponding to the chip.

As shown in FIGS. 2 (*q*) to 2 (*r*), after the rewiring process is completed, a solder 2115 is disposed on the second surface of the electrically conductive module exposed on the surface of the first encapsulation layer, and then the passive component 2116 is placed on the solder 2115 so that the pad on the passive component 2116 is electrically connected to the solder 2114.

In one embodiment, as shown in FIG. 2 (*s*), for the package structure provided with the passive component 2116, after the passive component 2116 is formed, cutting is performed so that each of the package units formed after the cutting includes at least one chip 201 to be packaged, at least one electrically conductive module 211 in the vicinity, and at least one passive component 2116 disposed on the at least one electrically conductive module. In the structure shown in FIG. 2 (*t*), each package unit after the cutting includes a chip, a plurality of electrically conductive modules and a plurality of passive components. Of course, in other embodiments, the amount of the chip, the electrically conductive module and the passive component included in each package unit may be set according to the actual situation. It should be noted that, one passive component 2116 needs to be electrically connected to two electrically conductive modules 211.

In one embodiment, a protective layer may also be formed on the active surface of the chip to be packaged before the at least one chip to be packaged and the at least one electrically conductive module are mounted on the carrier.

In this embodiment, a protective layer is formed on the active surface of the semiconductor wafer, i.e., the surface corresponding to the active surface of the chip 201 to be packaged, and then the semiconductor wafer formed with the protective layer is cut along the cutting line to obtain a plurality of chips 201 to be packaged formed with the protective layer.

The protective layer may be made of an insulating material, such as polyimide, epoxy resin, ABF (Ajinomoto buildup film), PBO (Polybenzoxazole) and the like. Optionally, the material of the protective layer is selected to be a material being insulating and capable of being adapted to chemical cleaning, grinding and the like. The protective layer may be formed on the semiconductor wafer by lamination, coating, printing or the like. Since a semiconductor wafer are typically thinned, for example, thinned to about 50 micrometers prior to being cut, when the semiconductor wafer is operated, by forming a protective layer on the active surface of the semiconductor wafer, not only the circuit on the active surface of the semiconductor wafer can be protected, but also the ultra-thin semiconductor wafer can be supported to some extent.

Hereinafter, a plurality of different chip package structures formed by using the above method of packaging the chip according to the present disclosure are exemplified.

Figure 3:
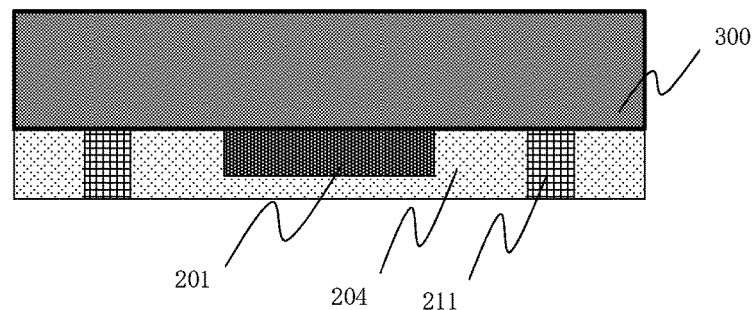
FIG. 3 is a schematic structural diagram of a chip package structure obtained according to a method of packaging a chip in an exemplary embodiment of the present disclosure.

FIG. 3 is a schematic structural diagram of a chip package structure obtained according to the method of packaging the chip provided by an exemplary embodiment of the present disclosure. As shown in FIG. 3, the chip package structure includes:

a first encapsulation layer 204 disposed with one concave first cavity and at least one concave second cavity;

at least one chip 201 to be packaged located in the first cavities, the back surface of the chip 201 to be packaged facing towards the first encapsulation layer 204;

at least one electrically conductive module 211 located in the second cavity; a rewiring structure 300 formed on the active surface of the chip 201 to be packaged and the first surface of the electrically conductive module 211 for leading out pads on the active surface of the chip 201 to be packaged and the first surface of the electrically conductive module 211.

In this embodiment, FIG. 3 only shows a form of package unit including one chip 201 to be packaged and a plurality of electrically conductive modules 211. However, in actual applications, each package unit may not necessarily include only one chip to be packaged, but may include a plurality of chips to be packaged, and each chip to be packaged may correspond to one or more electrically conductive modules 211.

Optionally, the thickness of the electrically conductive module 211 is greater than or equal to the thickness of the chip 201 to be packaged, and the depth of the first cavity is smaller than or equal to the depth of the second cavity.

Optionally, the second surface of the electrically conductive module 211 is exposed from the outer surface of the first encapsulation layer 204. At this time, the second cavity forms a hollow body penetrating the first encapsulation layer 204.

In one embodiment, the chip package structure further includes:

a sealing layer 203 formed on the upper surface of the first encapsulation layer 204 and at least wrapped around the chip and the electrically conductive module.

Figure 4:
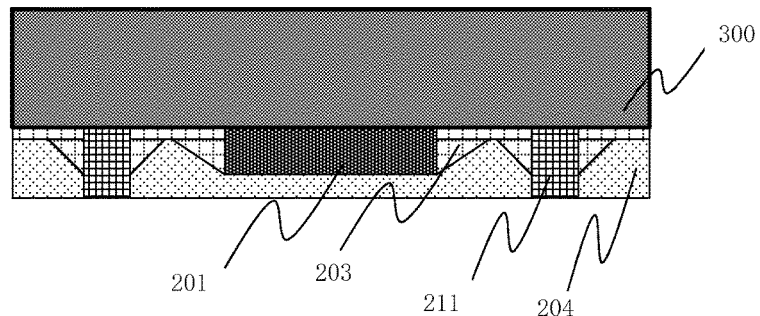
FIG. 4 is a schematic structural diagram of a chip package structure including a sealing layer obtained according to a method of packaging a chip in an exemplary embodiment of the present disclosure.

The chip package structure formed with the sealing layer 203 is shown in FIG. 4. It can be seen from FIG. 4 that the sealing layer 203 is formed between the rewiring structure 300 and the first encapsulation layer 204 and is at least wrapped around the chip 201 to be packaged and the electrically conductive module 211. In other embodiments, the sealing layer 203 may also cover the back surface of the chip 201 to be packaged.

The sealing layer 203 is continuously and uninterruptedly formed on the upper surface of the first encapsulation layer 204 and is at least wrapped around the chip 201 and the electrically conductive module 211. The sealing layer 203 may be a complete piece, or may be a one-layer structure having a plurality of holes exposing the second surface of the electrically conductive module and/or the back surface of the chip to be packaged without interruption. For the specific details, reference may be made to the above description of the method of packaging the chip.

Optionally, in one embodiment, the above-mentioned chip package structure may further include: a protective layer formed on the active surfaces of the plurality of chips, wherein the protective layer is formed with first openings, and the first openings are located at positions corresponding to the pads on the active surfaces of the plurality of chips.

The protective layer is formed prior to mounting the chip 201 to be packaged on the carrier 200 for protecting the circuit on the active surface of the chip and supporting the wafer before cutting the wafer into single chips. In order to form the rewiring structure, a plurality of first openings may be formed on the protective layer. The positions of the plurality of first openings correspond to the positions of the pads on the chips. The first openings may be formed after the protective layer is formed and before the chip is mounted on the carrier, or may also be formed after the carrier is detached. The specific selection depends on the actual situation.

In one embodiment, the above chip package structure further includes a passivation layer 205 which is formed on the active surface of the chip, the first surface of the electrically conductive module and the exposed first encapsulation layer, or formed on the active surface of the chip, the first surface of the electrically conductive module and the exposed sealing layer, or formed on the protective layer, the first surface of the electrically conductive module and the exposed sealing layer.

The passivation layer 205 is formed prior to forming the rewiring structure 300 for providing a flat and consistent surface for the rewiring layer. For the specific details, reference may be made to the above description of the method of packaging the chip.

In one embodiment, the rewiring structure 300 includes:

a first rewiring layer 206 formed on the passivation layer 205 and electrically connected to the pad on the chip 201 through the first opening of the passivation layer 205; and a second encapsulation layer 207 formed on the first rewiring layer 206 and the exposed passivation layer 205 and having a second opening, wherein a first electrically conductive stud 208 electrically connected to the first rewiring layer 206 is disposed in the second opening.

Figure 5:
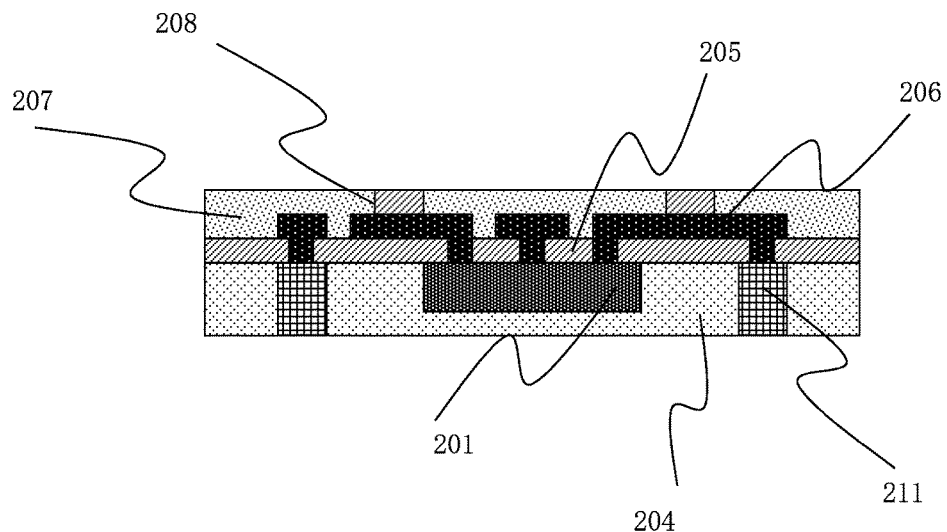
FIGS. 5 (*a*) to (*b*) are schematic structural diagrams of a single-layer chip package structure obtained according to a method of packaging a chip in an exemplary embodiment of the present disclosure.
Figure 5:
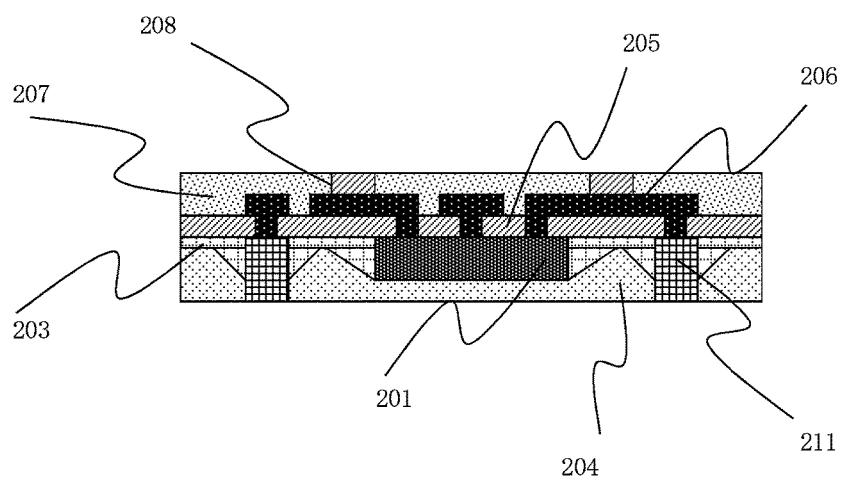

FIGS. 5 (a) and (b) show a chip package structure when the rewiring structure includes the first wiring layer 206 and the second encapsulation layer 207. Wherein, FIG. 5 (a) shows a chip package structure in the case where the sealing layer is not formed, and FIG. 5 (b) shows a chip package structure in the case where the sealing layer is formed. FIGS. 5 (a) and (b) schematically show the structure of a single package structure including only one chip and a plurality of electrically conductive modules. It can be understood that in other embodiments, the single package structure may include a plurality of chips and a plurality of electrically conductive modules.

In one embodiment, in the case where the protective layer is formed but the sealing layer and the passivation layer are not formed, the rewiring structure includes:

a first rewiring layer formed on the protective layer and the exposed first encapsulation layer and electrically connected to the pad of the chip through the first opening; and a second encapsulation layer formed on the first rewiring layer, the exposed protective layer and the first encapsulation layer and having a second opening, wherein a first electrically conductive stud electrically connected to the first rewiring layer is disposed in the second opening.

In one embodiment, in the case where the protective layer and the sealing layer are formed but the passivation layer is not formed, the rewiring structure includes:

a first rewiring layer formed on the protective layer and the exposed sealing layer and electrically connected to the pad of the chip through the first opening; and a second encapsulation layer formed on the first rewiring layer, the exposed protective layer and the sealing layer and having a second opening, wherein a first electrically conductive stud electrically connected to the first rewiring layer is disposed in the second opening.

For a multilayer package structure, on the basis of FIG. 5 and the two different situations described above, the rewiring structure 300 further includes:

a second rewiring layer 209 formed on the second encapsulation layer 207 and electrically connected to the pad or connection point of the first rewiring layer 206 through the first electrically conductive stud 208; and a third encapsulation layer 210 for encapsulating the second rewiring layer 209 and the exposed second encapsulation layer 207 and leading out the pad or the connection point of the second rewiring layer 209 through the second electrically conductive stud 2091.

Figure 6:
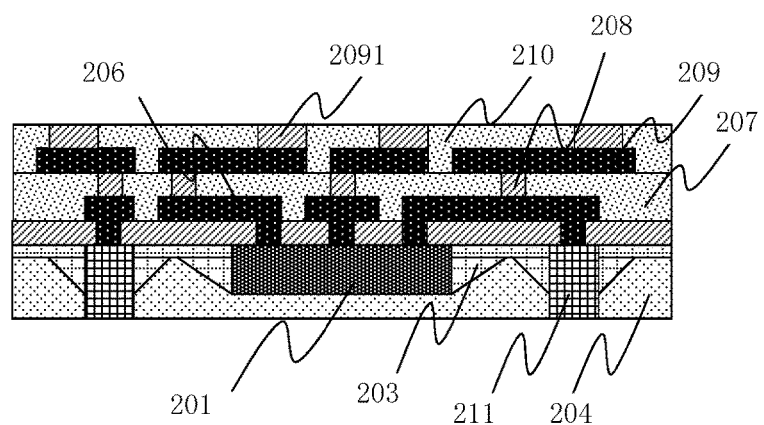
FIGS. 6 (*a*) to (*b*) are schematic structural diagrams of a multilayer chip package structure obtained according to a method of packaging a chip in an exemplary embodiment of the present disclosure.
Figure 6:
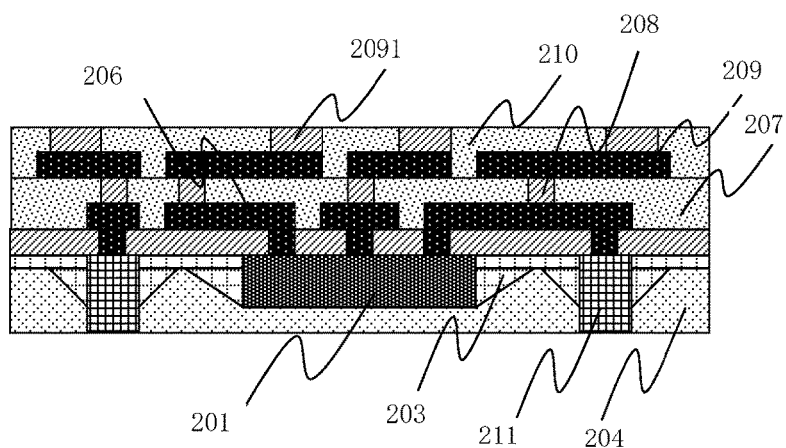

FIGS. 6 (a) and (b) show schematic structural diagrams of the rewiring structure 300 further including a second rewiring layer and a third encapsulation layer on the basis of FIG. 5. Wherein, FIG. 6 (a) shows a chip package structure in the case where the sealing layer is not formed, and FIG. 6 (b) shows a chip package structure in the case where the sealing layer is formed. FIGS. 6 (a) and (b) schematically show the structure of a single package structure including only one chip and a plurality of electrically conductive modules. It can be understood that in other embodiments, the single package structure may include a plurality of chips and a plurality of electrically conductive modules.

In one embodiment, the chip package structure further includes:

a thermally conductive structure located on the back surface of the chip and a second surface of the electrically conductive module, the second surface of the electrically conductive module being opposite to the first surface.

The thermally conductive structure is located on the back surface of the chip 201 to be packaged and the second surface of the electrically conductive module 211 for dissipating the heat generated by the chip 201 to be packaged through the electrically conductive module 211 during use.

Optionally, the thermally conductive structure includes:

a thermally conductive material formed on the back surface of the chip, the second surface of the electrically conductive module, and in a gap between the chip and electrically conductive module; and a thermally conductive plate disposed on the surface of the thermally conductive material.

Figure 7:
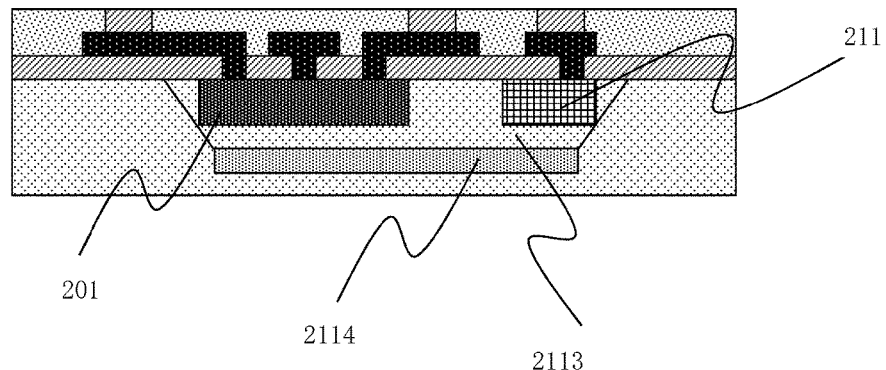
FIGS. 7 (*a*) to (*b*) are schematic structural diagrams of a chip package structure including a thermally conductive structure obtained according to a method of packaging a chip in an exemplary embodiment of the present disclosure.
Figure 7B:
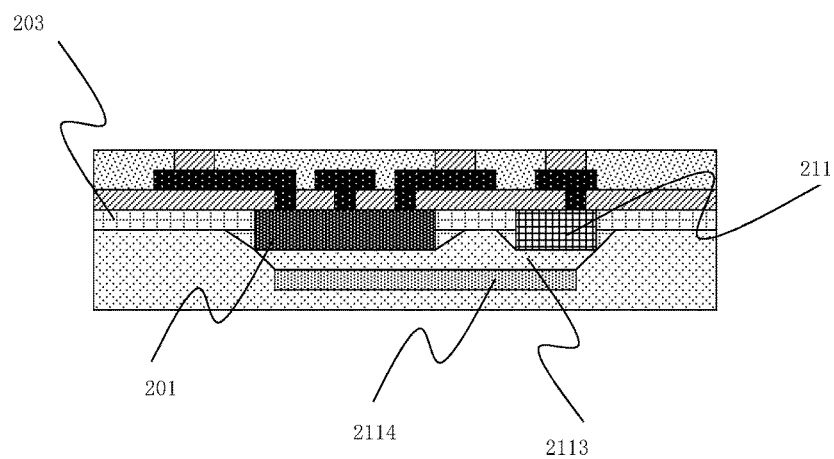

FIGS. 7 (a) to (b) show a single-layer chip package structure including a thermally conductive structure. One package unit only includes one chip to be packaged and one electrically conductive module. Of course, it can be understood that a multilayer chip package structure may also be formed on the basis of this. Wherein, FIG. 7 (a) shows a single-layer chip package structure formed with a sealing layer 203, and FIG. 7 (b) shows a single-layer chip package structure without sealing layer. The thermally conductive structure includes a thermally conductive material 2113 and a thermally conductive plate 2114. In terms of structure, one chip 201 to be packaged corresponds to one electrically conductive module 211, and the thermally conductive structure is formed on one chip 201 to be packed and one electrically conductive module 211 corresponding thereto. The thermally conductive structure may be in a one-to-one correspondence with the chip 201 to be packaged. For the specific details, reference may be made to the above description of the method of packaging the chip. In the structure shown in FIGS. 7 (a) to (b), the first encapsulation layer 204 encapsulates the thermally conductive structure, and the surface of the thermally conductive plate 2114 is not exposed from the surface of the first encapsulation layer 204. In other embodiments, the surface of the thermally conductive plate 2114 may also be exposed from the surface of the first encapsulation layer 204.

In one embodiment, the above chip package structure further includes:

a passive component disposed on the surface of the first encapsulation layer and electrically connected to the second surface of the electrically conductive module.

Figure 8:
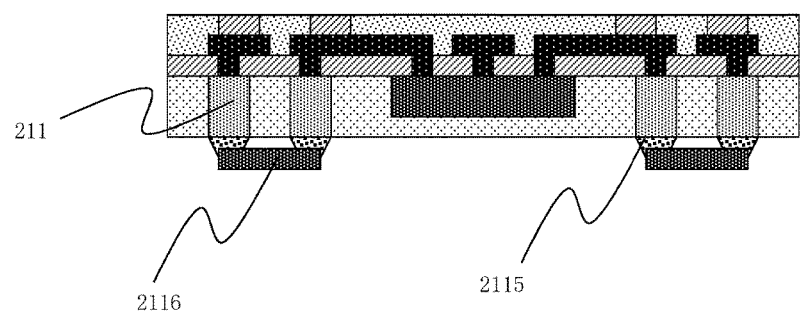
FIGS. 8 (*a*) to (*b*) are schematic structural diagrams of a chip package structure formed with a passive component obtained according to a method of packaging a chip in an exemplary embodiment of the present disclosure.
Figure 8:
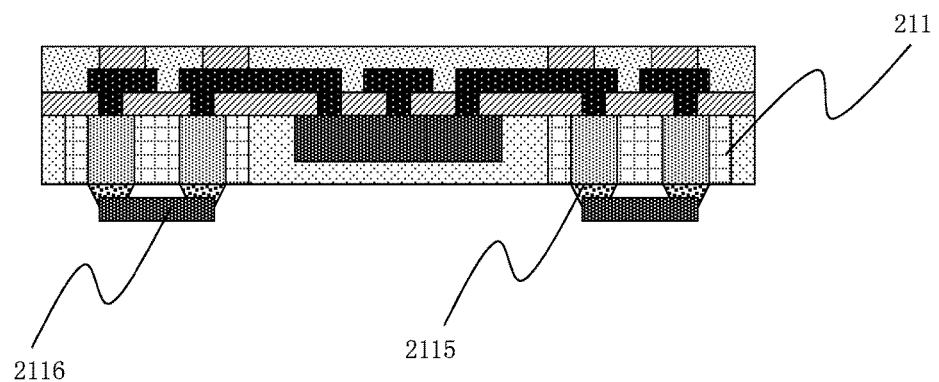

FIGS. 8 (a) to (b) show a single-layer chip package structure including a passive component. One package unit only includes one chip to be packaged and one electrically conductive module. Of course, it can be understood that a multilayer chip package structure may also be formed on the basis of this. The single-layer chip package structure shown in FIGS. 8 (a) to (b) does not include the sealing layer 203. It can be understood that, in other embodiments, a sealing layer may be formed. For the specific details, reference may be made to the other embodiments described above, and details are not described herein again. Wherein, in the structure shown in FIG. 8 (a), each passive component is electrically connected to a plurality of electrically conductive modules 211; and in the structure shown in FIG. 8 (b), each passive component is electrically connected to one electrically conductive module 211, the electrically conductive module 211 being a composite body including a plurality of electrically conductive studs.

The chip package structure described above can be obtained by the above method of packing the chip and the process flow shown in FIGS. 2 (a) to (t). For the specific details, reference may be made to above detailed description of the method of packaging the chip and the process flow, and details are not described herein again.

The embodiment of the present disclosure further provides a stacked type chip package structure, including:

at least one first chip package structure as described above;

at least one second chip package structure comprising a packaged chip and a rewiring structure for leading out the pad on the active surface of the chip, wherein, the rewiring structure of the at least one second chip package structure is electrically connected to the second surface of the electrically conductive module of the at least one first chip package structure, and the second surface of the electrically conductive module and the first chip package structure may be the above chip package structure including the electrically conductive module, which is manufactured by using the above method of packaging a chip; and the second chip package structure may be an ordinary chip package structure including a packaged chip and a rewiring structure formed on the active surface of the chip. Of course, it can be understood that the second chip package structure may also be the above chip package structure including the electrically conductive module, which is manufactured by the above method of packaging a chip. In order to realize the stack, the rewiring structure of the second chip package structure is electrically connected to the second surface of the electrically conductive module of the first chip package structure. The rewiring structure of the second chip package structure includes at least one rewiring layer and an electrically conductive stud for leading out the outermost rewiring layer. The electrically conductive stud may be electrically connected to the second surface of the electrically conductive module in the first chip package structure by solder.

Figure 9:
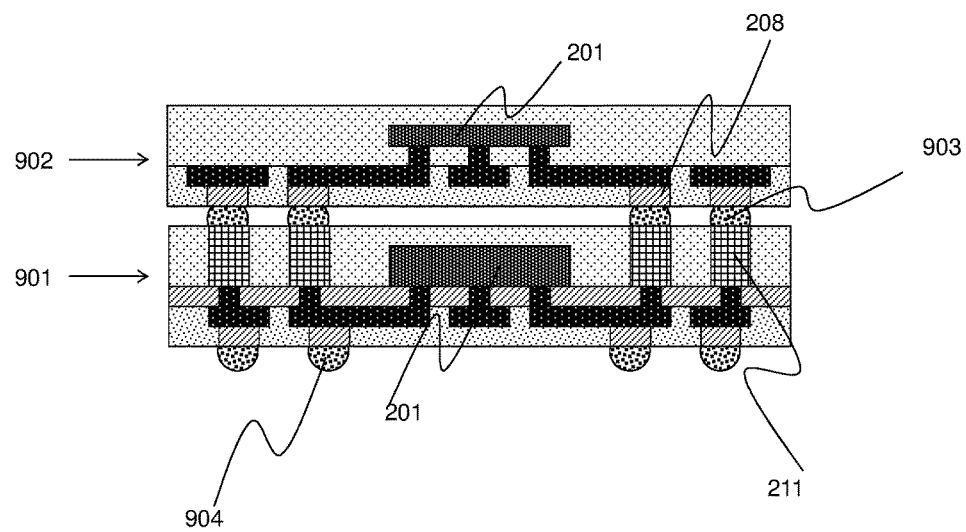
FIGS. 9 (*a*) to (*b*) are schematic structural diagrams of a stacked type chip package structure obtained according to a method of packaging a chip in an exemplary embodiment of the present disclosure.
Figure 9:
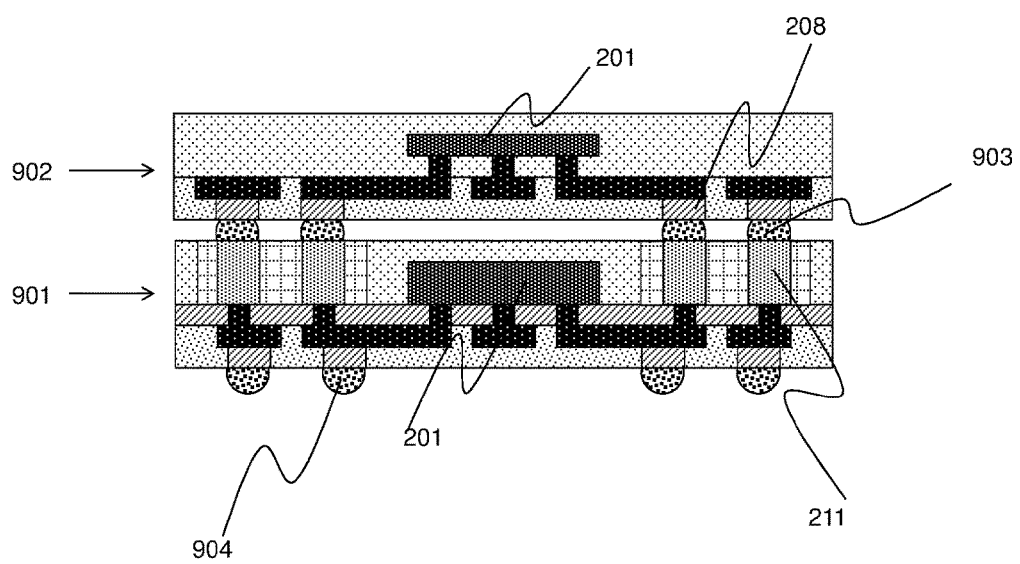

FIGS. 9 (a) and (b) show a schematic diagram of a stacked type chip package structure. Wherein, the first chip package structure 901 and the second chip package structure 902 are both single-layer package structures (i.e., only include one layer of rewiring layer), and the second chip package structure 901 does not include the electrically conductive module. However, it can be understood that an upper electrically conductive module may also be packaged in the second chip package structure 901 so as to be overlapped with other chip package structures, or a passive component may be disposed, or a thermally conductive structure may be disposed, and so on. In FIG. 9 (a), the first chip package structure 901 is provided with a plurality of electrically conductive modules 211 corresponding to the chip to be packaged, and each of the electrically conductive modules 211 is an individual metal post or metal block. In FIG. 9 (b), the first chip package structure 901 is provided with a plurality of electrically conductive modules 211 corresponding to the chip 201 to be packaged, and each of the electrically conductive modules is an array composite structure including a plurality of metal posts or metal blocks. The pad on the electrically conductive module in the first chip package structure 901 is electrically connected to the first electrically conductive stud 208 in the second chip package structure 902 by the solder 903. Optionally, a solder 904 is disposed on the first electrically conductive stud of the second chip package structure 902, and the second chip package structure 902 may also be used for stacking with other chip package structures.

The above specific embodiments are used to describe the objectives, technical solutions and beneficial effects of the present disclosure in further detail. It should be understood that the foregoing is only the specific embodiments of the present disclosure and is not intended to limit the present disclosure. Any modifications, equivalent replacements, improvements, and the like made within the spirit and principle of the present disclosure should be included in the scope of the present disclosure.

What is claimed is:

1. A method of packaging a chip, comprising:
    mounting at least one chip to be packaged and at least one electrically conductive module on a carrier, wherein the at least one chip to be packaged has a back surface facing upwards and an active surface facing towards the carrier, and the at least one electrically conductive module is in the vicinity of the at least one chip to be packaged;
    forming a first encapsulation layer, wherein the first encapsulation layer covers the entire carrier for encapsulating the at least one chip to be packaged and the at least one electrically conductive module, wherein the first encapsulation layer is disposed with at least one concave first cavity and at least one concave second cavity, wherein the at least one chip is located in the at least one first cavity, the back surface of the at least one chip facing towards the first encapsulation layer, and the at least one electrically conductive module is located in the at least one second cavity, wherein the first encapsulation layer encapsulates the at least one electrically conductive module and wherein the at least one electrically conductive module comprises an electrically conductive array formed by a plurality of electrically conductive studs, the electrically conductive array being integrally packaged by an insulating material;
    detaching the carrier to expose the active surface of the at least one chip to be packaged and a first surface of the at least one electrically conductive module; and
    completing the packaging by a rewiring process on the active surface of the at least one chip to be packaged and the first surface of the at least one electrically conductive module, wherein a rewiring structure is formed on the active surface of the at least one chip and the first surface of the at least one electrically conductive module for leading out pads on the active surface of the at least one chip and the first surface of the at least one electrically conductive module.

2. The method according to claim 1, wherein the step of mounting the at least one chip to be packaged and the at least one electrically conductive module on the carrier comprises:
    forming an adhesive layer on the carrier; and
    mounting the at least one electrically conductive module at a first predetermined position of the carrier, and mounting the at least one chip to be packaged at a second predetermined position of the carrier by the adhesive layer.

3. The method according to claim 1, wherein a thickness of the at least one electrically conductive module is greater than or equal to a thickness of the at least one chip to be packaged.

4. The method according to claim 1, wherein the electrically conductive module is an electrically conductive array formed by a plurality of electrically conductive studs, and the electrically conductive array is integrally packaged by an insulating material.

5. The method according to claim 4, wherein the electrically conductive array has at least one opening in the middle; and the at least one chip to be packaged is located in the at least one opening when the electrically conductive array and the at least one chip to be packaged arc mounted on the carrier.

6. The method according to claim 1, wherein prior to forming the first encapsulation layer, the method further comprises:
    forming a sealing layer at least wrapped around the at least one chip to be packaged and the at least one electrically conductive module.

7. The method according to claim 6, wherein the step of forming the sealing layer comprises:
    covering a scaling material on the carrier mounted with the at least one chip to be packaged and the at least one electrically conductive module by using a semiconductor process; and
    curing the sealing material to form the sealing layer.

8. The method according to claim 6, wherein a height of the sealing layer is lower than a height of the at least one chip to be packaged, and the sealing layer is a thermosetting insulating material or an ultraviolet curing insulating material.

9. The method according to claim 6, wherein the sealing layer continuously and uninterruptedly covers the surface of the first encapsulation layer and is at least wrapped around the chip.

10. The method according to claim 1, wherein after forming the first encapsulation layer, the method further comprises:
    thinning the first encapsulation layer to expose a second surface of the at least one electrically conductive module.

11. The method according to claim 1, wherein prior to forming the first encapsulation layer, the method further comprises:
    forming a thermally conductive structure which includes a thermally conductive material covering the back surface of the at least one chip to be packaged and the second surface of the at least one electrically conductive module, and covering between the at least one chip to be packaged and the at least one electrically conductive module; and a thermally conductive plate formed on a surface of the thermally conductive material.

12. The method according to claim 11, wherein the thermally conductive structure is in a one-to-one correspondence with a unit cut after the packaging is completed, and each unit comprises at least one chip to be packaged and at least one electrically conductive module.

13. The method according to claim 11, wherein after forming the first encapsulation layer, the method further comprises:

thinning the first encapsulation layer to expose a surface of the thermally conductive plate of the thermally conductive structure.

14. The method according to claim 1, wherein the step of completing the packaging by the rewiring process on the active surface of the at least one chip to be packaged comprises:
forming a passivation layer to planarize a side where the active surface of the at least one chip to be packaged and the first surface of the at least one electrically conductive module are located.

15. The method according to claim 14, wherein after forming the passivation layer, the method further comprises:
forming a first opening on the passivation layer, the first opening being located at a pad of the at least one chip to be packaged and the at least one electrically conductive module; and
forming a first rewiring layer on the passivation layer, the first rewiring layer being electrically connected to the pad of the chip to be packaged and the at least one electrically conductive module through the first opening.

16. The method according to claim 15, further comprising:
forming a second encapsulation layer on the first rewiring layer and leading out a pad or a connection point of the first rewiring layer by a first electrically conductive stud.

17. The method according to claim 16, wherein the step of forming the second encapsulation layer on the first rewiring layer and leading out the pad or the connection point of the first rewiring layer through the first electrically conductive stud comprises:
forming the first electrically conductive stud on the pad or the connection point of the first rewiring layer; and
forming the second encapsulation layer on the first rewiring layer and the exposed passivation layer and exposing the first electrically conductive stud; or
the step of forming the second encapsulation layer on the first rewiring layer and leading out the pad or the connection point of the first rewiring layer through the first electrically conductive stud comprises:
forming the second encapsulation layer on the first rewiring layer and the exposed passivation layer;
forming a second opening on the second encapsulation layer at a position corresponding to the pad or the connection point of the first rewiring layer; and
forming the first electrically conductive stud in the second opening.

18. The method according to claim 16, further comprising:
forming a second rewiring layer on the second encapsulation layer, the second rewiring layer being electrically connected to the pad or the connection point of the first rewiring layer through the first electrically conductive stud; and
forming a third encapsulation layer on the second rewiring layer and leading out a pad or a connection point of the second rewiring layer by a second electrically conductive stud.

19. The method according to claim 17, wherein, the step of forming a third encapsulation layer on a second rewiring layer and leading out a pad or a connection point of the second rewiring layer by a second electrically conductive stud, comprises:
forming the second electrically conductive stud on the pad or the connection point of the second rewiring layer; and
forming the third encapsulation layer on the second rewiring layer and the exposed second encapsulation layer and exposing the second electrically conductive stud; or
forming a third encapsulation layer to encapsulate the second rewiring layer and the exposed second encapsulation layer and leading out the pad or the connection point of the second rewiring layer through the second electrically conductive stud, comprising:
forming the third encapsulation layer on the second rewiring layer and the exposed second encapsulation layer;
forming a third opening on the third encapsulation layer at a position corresponding to the pad or the connection point of the second rewiring layer; and
forming the second electrically conductive stud in the third opening.

20. The method according to claim 1, wherein after completing the packaging by the rewiring process on the active surface of the at least one chip to be packaged and the first surface of the at least one electrically conductive module, the method further comprises:
performing cutting so that each package unit formed after the cutting comprises at least one chip to be packaged and at least one electrically conductive module in the vicinity.

21. The method according to claim 1, wherein after completing the packaging by the rewiring process on the active surface of the at least one chip to be packaged and the first surface of the at least one electrically conductive module, the method further comprises:
disposing at least one passive component on the surface of the first encapsulation layer, the at least one passive component being electrically connected to the second surface of the at least one electrically conductive module.

22. The method according to claim 21, wherein after disposing the at least one passive component on the surface of the first encapsulation layer, the method further comprises:
performing cutting so that each package unit formed after the cutting comprises at least one chip to be packaged, at least one electrically conductive module in the vicinity, and at least one passive component disposed on the at least one electrically conductive module.

23. The method according to claim 1, wherein prior to mounting the at least one chip to be packaged and the at least one electrically conductive module on the carrier, the method further comprises:
forming a protective layer on the active surface of the chip to be packaged.

24. A chip package structure, comprising:
a first encapsulation layer disposed with a plurality of concave first cavities and a plurality of concave second cavities, the second cavities being disposed in the vicinity of the first cavities;
a plurality of chips respectively located in the plurality of first cavities, a back surface of the chip facing towards the first encapsulation layer;
a plurality of electrically conductive modules respectively located in the plurality of second cavities, wherein the first encapsulation layer encapsulates the electrically conductive modules and wherein at least one of the electrically conductive modules comprises an electrically conductive array formed by a plurality of electrically conductive studs, the electrically conductive array being integrally packaged by an insulating material; and a rewiring structure formed on active surfaces of the chips and first surfaces of the electrically conductive modules for leading out pads on the active surfaces of the chips and the electrically conductive modules.

25. A chip package structure, comprising:

a first encapsulation layer disposed with one concave first cavity and at least one concave second cavity;

a chip located in the first cavity, a back surface of the chip facing towards the first encapsulation layer;

at least one electrically conductive module located in the at least one concave second cavity, wherein the first encapsulation layer encapsulates the at least one electrically conductive module and wherein the at least one electrically conductive module comprises an electrically conductive array formed by a plurality of electrically conductive studs, the electrically conductive array being integrally packaged by an insulating material; and a rewiring structure formed on an active surface of the chip and a first surface of the at least one electrically conductive module for leading out pads on the active surface of the chip and the first surface of the electrically conductive module.

26. The chip package structure according to claim 24, further comprising:

a sealing layer formed on an upper surface of the first encapsulation layer and at least wrapped around the chip and the electrically conductive module.

27. The chip package structure according to claim 26, wherein the sealing layer is continuously and uninterruptedly formed on the upper surface of the first encapsulation layer and is at least wrapped around the chip and the electrically conductive module.

28. The chip package structure according to claim 24, further comprising:

a protective layer formed on the active surfaces of the plurality of chips, wherein the protective layer is formed with first openings, and the first openings are located at positions corresponding to the pads on the active surfaces of the plurality of chips.

29. The chip package structure according to claim 24, further comprising:

a passivation layer which is formed on the active surface of the chip, the first surface of the electrically conductive module and the exposed first encapsulation layer, or formed on the active surface of the chip, the first surface of the electrically conductive module and the exposed sealing layer, or formed on the protective layer, the first surface of the electrically conductive module and the exposed sealing layer.

30. The chip package structure according to claim 29, wherein the rewiring structure comprises:

a first rewiring layer formed on the passivation layer and electrically connected to the pad of the chip through the first opening of the passivation layer; and a second encapsulation layer formed on the first rewiring layer and the exposed passivation layer and having a second opening, wherein a first electrically conductive stud electrically connected to the first rewiring layer is disposed in the second opening.

31. The chip package structure according to claim 29, wherein the rewiring structure comprises:

a first rewiring layer formed on the protective layer and the exposed first encapsulation layer or the sealing layer and electrically connected to the pad of the chip through the first opening; and a second encapsulation layer formed on the first rewiring layer, the exposed protective layer and the sealing layer, or formed on the first rewiring layer, the exposed protective layer and the first encapsulation layer, and having a second opening, wherein a first electrically conductive stud electrically connected to the first rewiring layer is disposed in the second opening.

32. The chip package structure according to claim 30, wherein the rewiring structure further comprises:

a second rewiring layer formed on the second encapsulation layer and electrically connected to the pad or a connection point of the first rewiring layer through the first electrically conductive stud; and a third encapsulation layer for encapsulating the second rewiring layer and the exposed second encapsulation layer and leading out the pad or a connection point of the second rewiring layer through the second electrically conductive stud.

33. The chip package structure according to claim 24, wherein a thickness of the electrically conductive module is greater than or equal to a thickness of the chip.

34. The chip package structure according to claim 24, wherein the electrically conductive module is an electrically conductive array formed by a plurality of electrically conductive studs, and the electrically conductive array is integrally packaged by an insulating material.

35. The chip package structure according to claim 34, wherein the electrically conductive array has at least one opening in the middle; and the chip is located in the at least one opening when the electrically conductive array and the chip are mounted on a carrier.

36. The chip package structure according to claim 24, wherein a second surface of the electrically conductive module is exposed from a surface of the first encapsulation layer; and the second surface of the electrically conductive module is opposite to the first surface.

37. The chip package structure according to claim 24, further comprising:

a thermally conductive structure located on the back surface of the chip and a second surface of the electrically conductive module, the second surface of the electrically conductive module being opposite to the first surface.

38. The chip package structure according to claim 37, wherein the thermally conductive structure comprises:

a thermally conductive material formed on the back surface of the chip, the second surface of the electrically conductive module, and in a gap between the chip and electrically conductive module; and a thermally conductive plate disposed on a surface of the thermally conductive material.

39. The chip package structure according to claim 24, further comprising:

a passive component disposed on a surface of the first encapsulation layer and electrically connected to a second surface of the electrically conductive module.

40. A stacked type chip package structure, comprising:

at least one first chip package structure according to claim 24; and at least one second chip package structure comprising a packaged chip and a rewiring structure for leading out a pad on an active surface of the chip, wherein, the rewiring structure of the at least one second chip package structure is electrically connected to a second surface of an electrically conductive module of the at least one first chip package structure, and a second surface of the electrically conductive module is opposite to the first surface.

41. The chip package structure according to claim 40, wherein the rewiring structure of the second chip package structure comprises a rewiring layer and an electrically conductive stud for leading the rewiring layer out of the chip package structure, the electrically conductive stud being electrically connected to a pad or a connection point on the second surface of the electrically conductive module of the first chip package structure.

42. A stacked type chip package structure, comprising:
   at least one first chip package structure according to claim 24; and
   at least one second chip package structure comprising a packaged chip and a rewiring structure for leading out a pad on an active surface of the chip, wherein,
   the rewiring structure of the at least one second chip package structure is electrically connected to a second surface of an electrically conductive module of the at least one first chip package structure, and a second surface of the electrically conductive module is opposite to the first surface; and, wherein the second chip package structure is the chip package structure according to claim 24.

* * * * *

UNITED STATES PATENT AND TRADEMARK OFFICE
CERTIFICATE OF CORRECTION

PATENT NO. : 10,431,477 B2  
APPLICATION NO. : 15/826261  
DATED : October 1, 2019  
INVENTOR(S) : Hwee Seng Jimmy Chew Page 1 of 1

It is certified that error appears in the above-identified patent and that said Letters Patent is hereby corrected as shown below:

On the Title Page

Item (73), Assignee should read:
-- PEP INNOVATION PTE LTD. --

Signed and Sealed this
Second Day of June, 2020

Andrei Iancu
*Director of the United States Patent and Trademark Office*